(12) United States Patent  
Kim et al.

(10) Patent No.: US 8,648,434 B2  
(45) Date of Patent: Feb. 11, 2014

(54) MAGNETIC MEMORY DEVICES

(75) Inventors: Woojin Kim, Yongin-si (KR); Jangeun Lee, Suwon-si (KR); Sechung Oh, Suwon-si (KR); Younghyun Kim, Seoul (KR); Sukhun Choi, Suwon-si (KR); Woochang Lim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 104 days.

(21) Appl. No.: 13/236,888

(22) Filed: Sep. 20, 2011

(65) Prior Publication Data  
US 2012/0112298 A1 May 10, 2012

(30) Foreign Application Priority Data  
Nov. 8, 2010 (KR) ........................ 10-2010-0110520

(51) Int. Cl.  
H01L 29/82 (2006.01)

(52) U.S. Cl.  
USPC .................................. 257/421; 257/E29.323

(58) Field of Classification Search  
USPC .......................................... 257/421; 365/158  
See application file for complete search history.

(56) References Cited

U.S. PATENT DOCUMENTS

| 5,695,864 | A | 12/1997 | Slonczewski |
| 6,992,359 | B2 | 1/2006 | Nguyen et al. |
| 7,161,829 | B2* | 1/2007 | Huai et al. ................. 365/158 |
| 7,242,045 | B2 | 7/2007 | Nguyen et al. |
| 7,732,881 | B2 | 6/2010 | Wang |
| 8,018,011 | B2* | 9/2011 | Ranjan et al. ............... 257/421 |
| 2002/0041515 | A1* | 4/2002 | Ikeda et al. ................. 365/158 |
| 2006/0119990 | A1* | 6/2006 | Nishiyama et al. ....... 360/324.11 |
| 2008/0080098 | A1* | 4/2008 | Fuke et al. .................. 360/314 |
| 2008/0191251 | A1* | 8/2008 | Ranjan et al. ............... 257/295 |
| 2008/0191295 | A1* | 8/2008 | Ranjan et al. ............... 257/421 |
| 2009/0290408 | A1* | 11/2009 | Lou et al. .................... 365/158 |
| 2010/0226169 | A1* | 9/2010 | Gao et al. .................... 365/171 |
| 2011/0051503 | A1* | 3/2011 | Hu et al. ...................... 365/158 |

FOREIGN PATENT DOCUMENTS

| KR | 10-0856185 | 8/2008 |
| KR | 10-0856197 | 8/2008 |
| KR | 10-2009-0113327 | 10/2009 |

OTHER PUBLICATIONS

E.B. Myers et al., "Current-Induced Switching of Domains in Magnetic Multilayer Devices", Science 285, 867 (1999).  
J.C. Slonczewski, "Current-driving Excitation of Magnetic Multilayers", Journal of Magnetism and Magnetic Materials 159 (1996) L1-L7.  
L. Berger, "Emission of spin waves by a magnetic multilayer traversed by a current", Physical Review B, vol. 54, No. 13, pp. 9353-9358 (1996).

* cited by examiner

*Primary Examiner* — Kimberly Rizkallah  
*Assistant Examiner* — Mounir Amer  
(74) *Attorney, Agent, or Firm* — Volentine & Whitt, PLLC

(57) ABSTRACT

A magnetic memory device includes a magnetic pattern, a reference pattern, a tunnel barrier pattern interposed between the magnetic pattern and the reference pattern, and at least one magnetic segment disposed inside the magnetic pattern. The magnetic segment(s) is/are of magnetic material whose direction of magnetization has at least a component which lies in a plane perpendicular to the magnetization direction of the magnetic pattern.

20 Claims, 20 Drawing Sheets

MAGNETIC MEMORY DEVICES

PRIORITY STATEMENT

This U.S. non-provisional patent application claims priority under 35 U.S.C. §119 of Korean Patent Application No. 10-2010-0110520, filed on Nov. 8, 2010, the entire contents of which are hereby incorporated by reference.

BACKGROUND

The inventive concept relates to electronic memories. More particularly, the inventive concept relates to memory devices having a magnetic tunnel junction.

Memories of today's electronic devices must operate at high speeds while consuming low amounts of power. More specifically, there is a demand for memory devices which can perform a read/write operation at high speeds at a low voltage. Magnetic memory devices are in the limelight as next generation memory devices developed to meet this demand. Magnetic memory devices are not only capable of high speed operation but are nonvolatile.

Conventional magnetic memory devices include a magnetic tunnel junction (MTJ). The magnetic tunnel junction has two magnetic bodies and a tunnel barrier layer disposed therebetween. Resistance of the magnetic tunnel junction can be changed by changing the direction of magnetization of the two magnetic bodies. Specifically, the magnetic tunnel junction has a relatively high resistance when the magnetization directions of the two magnetic bodies are anti-parallel. On the other hand, the magnetic tunnel junction has a relatively small resistance when the magnetization directions of the two magnetic bodies are parallel. The value of the resistance of a magnetic memory device can be sensed as the logic state of or data stored by the device. Thus, the resistance of a magnetic memory device can be changed to change the data recorded or stored by the magnetic memory device.

SUMMARY

According to one aspect of the inventive concept, there is provided a magnetic memory device comprising: a magnetic pattern and a reference pattern juxtaposed on a substrate, a tunnel barrier pattern interposed between the magnetic pattern and the reference pattern, and at least one magnetic segment disposed in the magnetic pattern. The reference pattern is of magnetic material having a magnetization whose orientation is fixed. The magnetization of the magnetic pattern is changeable between a first state in which the magnetization directions of the magnetic pattern and the reference pattern are parallel and a second state in which the magnetization directions of the magnetic pattern and reference pattern are anti-parallel. The magnetic segment is of magnetic material whose direction of magnetization has at least a component coincident with a plane perpendicular to the direction of magnetization of the magnetic pattern.

According to another aspect of the inventive concept, there is provided a magnetic memory device comprising: a magnetic pattern and first and second reference patterns juxtaposed with the magnetic pattern on a substrate, a first tunnel barrier pattern interposed between the magnetic pattern and the first reference pattern, at least one magnetic segment disposed in the magnetic pattern, and a second tunnel barrier pattern interposed between the second reference pattern and the magnetic pattern. The first and second reference patterns are each of magnetic material having a magnetization whose orientation is fixed. The magnetization of the magnetic pattern is changeable between a first state in which the magnetization directions of the magnetic pattern and the first reference pattern are parallel and a second state in which the magnetization directions of the magnetic pattern and first reference pattern are anti-parallel. The magnetic segment is of magnetic material whose direction of magnetization has at least one component coincident with a plane perpendicular to the direction of magnetization of the magnetic pattern, and the magnetization direction of the first reference pattern and the magnetization direction of the second reference pattern are anti-parallel.

According to still another aspect of the inventive concept, there is provided a magnetic memory device comprising: a first magnetic pattern and a first magnetic reference pattern juxtaposed with the first magnetic pattern on a substrate, a first tunnel barrier pattern interposed between the first magnetic pattern and the first reference pattern, at least one magnetic segment disposed in the first magnetic pattern, a second magnetic pattern and a second reference pattern juxtaposed with the second magnetic pattern on the substrate, a second tunnel barrier pattern interposed between the second magnetic pattern and the second reference pattern, at least one magnetic segment disposed in the second magnetic pattern, and an interlayer pattern interposed between the first and second magnetic patterns. The first and second reference patterns are each of magnetic material having a magnetization whose orientation is fixed. The magnetization of the first magnetic pattern is changeable between a first state in which the magnetization directions of the first magnetic pattern and the first reference pattern are parallel and a second state in which the magnetization directions of the first magnetic pattern and first reference pattern are anti-parallel. The magnetic segment disposed in the first magnetic pattern is of magnetic material whose direction of magnetization has at least a component coincident with a plane perpendicular to the direction of magnetization of the first magnetic pattern, the magnetic segment disposed in the second magnetic pattern is of magnetic material whose direction of magnetization has at least a component coincident with a plane perpendicular to the direction of magnetization of the second magnetic pattern, and the magnetization of the second magnetic pattern and the magnetization of the first magnetic pattern are coupled such that the directions of magnetization of the first and second magnetic patterns are anti-parallel.

DETAILED DESCRIPTION OF THE PREFERRED EMBODIMENTS

Figure 1A:
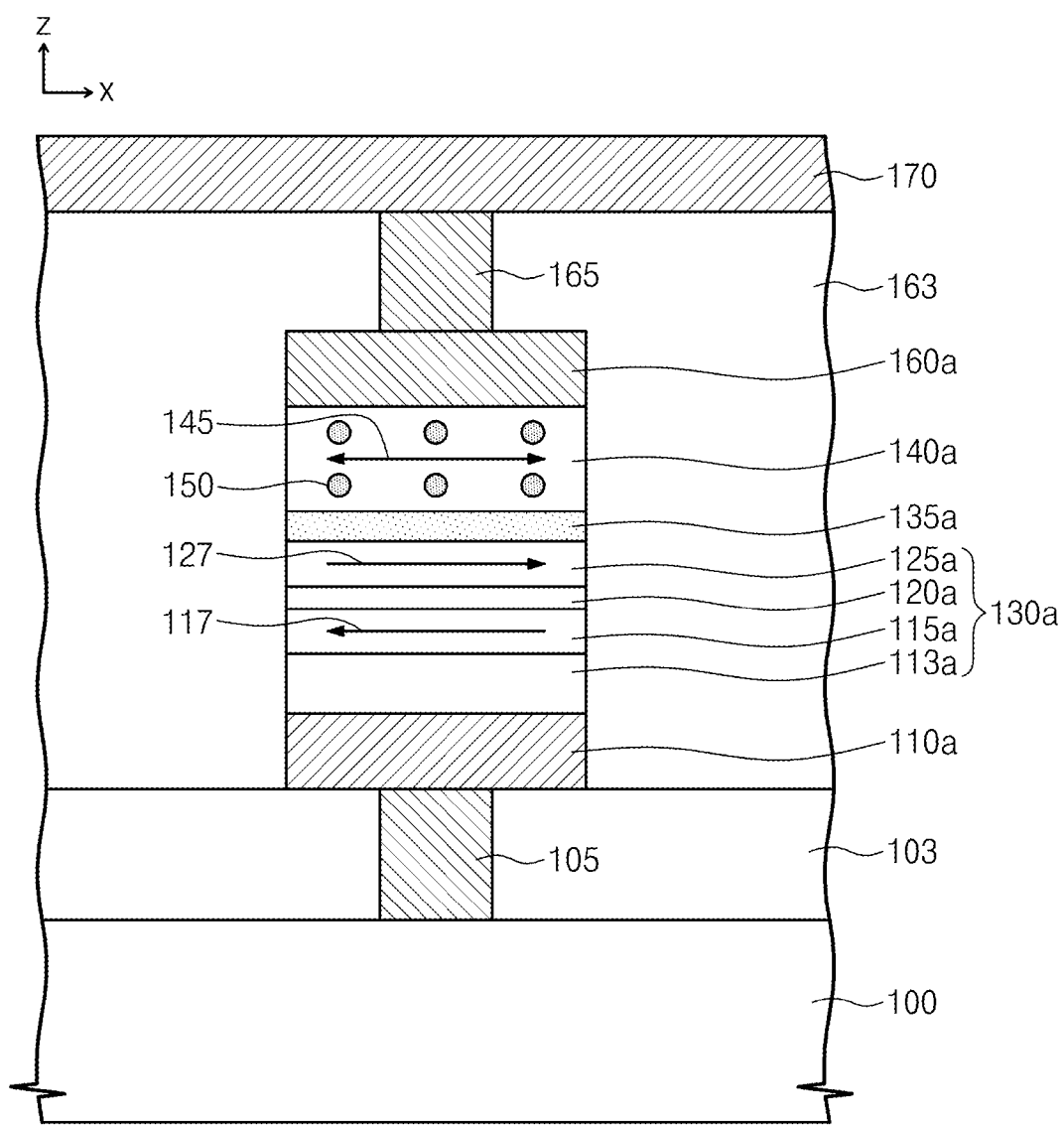
FIG. 1A is a cross-sectional view of an embodiment of a magnetic memory device according to the inventive concept.

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the devices and intermediate structures fabricated during the course of their manufacture are schematic. Also, like numerals are used to designate like elements throughout the drawings.

Furthermore, spatially relative terms, such as "top," and "bottom" are used to describe an element's and/or feature's orientation as illustrated in the figures. Obviously, though, all such spatially relative terms are used for ease of description and are not necessarily limiting as embodiments according to the inventive concept can assume orientations different than those illustrated in the drawings when in use.

It will also be understood that when an element or layer is referred to as being "on" another element or layer, it can be directly on or directly connected to the other element or layer or intervening elements or layers may be present. In contrast, when an element or layer is referred to as being "directly on" or in "contact" with another element or layer, there are no intervening elements or layers present.

Furthermore, as used herein, the term "and/or" includes any and all practical combinations of one or more of the associated listed items.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "pattern" will generally refer to an element that has been formed by some patterning process, and may refer to either a mono-layer or a composite layer.

Examples of an embodiment of a magnetic memory device according to the inventive concept will now be described in more detail with reference to the FIGS. 1A-1E.

Referring first to FIG. 1A, a unit switch (not shown in the figure) is disposed on a substrate 100. The substrate 100 may be a silicon substrate, a germanium substrate or a silicon-germanium substrate. The unit switch may be a field effect transistor or a diode. A first interlayer dielectric layer 103 is disposed over the entire surface of the substrate 100 on the unit switch. The first interlayer dielectric layer 103 may comprise an oxide, nitride and/or oxynitride. A lower contact plug 105 is disposed in a lower contact hole formed through the interlayer dielectric layer 103 and is connected to a terminal of the unit switch. The lower contact plug 105 may be of doped semiconductor material such as doped silicon, a metal such as tungsten, copper or aluminum, a conductive metal nitride such as titanium nitride or tantalum nitride, a transition metal such as titanium or tantalum, and/or a metal-semiconductor compound such as a metal silicide.

In an example of the inventive concept in which the unit switch is a diode, at least a part of the unit switch fills a low part of the lower contact hole and the upper part of the lower contact hole is filled with the lower contact plug 105.

The magnetic memory device according to the inventive concept comprises a magnetic memory element having a reference pattern 130a, a tunnel barrier pattern 135a, a magnetic pattern 140a and at least one perpendicular magnetic segment 150 disposed in the magnetic pattern (which individually or collectively may be referred to as a perpendicular magnetic section of the magnetic memory element).

The reference pattern 130a and magnetic pattern 140a are disposed on the first interlayer dielectric layer 103 with the tunnel barrier pattern 135a interposed therebetween. The direction of magnetization 127 (hereinafter "magnetization direction 127") of the reference pattern 130a is fixed. The direction of magnetization 145 (hereinafter "magnetization direction 145") of the magnetic pattern 140a is changeable (described in more detail later on) such that it can be either parallel or anti-parallel to the magnetization direction 127 of the reference pattern 130a. In this embodiment, the surface of the magnetic pattern 140a adjacent to the tunnel barrier pattern 135a (i.e., the bottom surface of the magnetic pattern 140a) is flat, and the magnetization directions of the reference pattern 130a and the magnetic pattern 140a are substantially parallel to the bottom surface of the magnetic pattern 140a. Also, in the embodiment shown in FIG. 1A, the surface of the magnetic pattern 140a adjacent to the tunnel barrier pattern 135a is substantially parallel to the top surface of the substrate 100.

A first electrode 110a is interposed between the magnetic memory element and the first interlayer dielectric layer 103. The first electrode 110a may contact the lower contact plug 105. A second electrode 160a is disposed on the magnetic memory element. For example, as shown in FIG. 1A, the second electrode 160a is disposed directly on the top surface of the magnetic pattern 140a Thus, the magnetic memory element is interposed between the first electrode 110a and the second electrode 160a.

A second interlayer dielectric layer 163 is disposed on the substrate 100. The second interlayer dielectric layer 163 may comprise an oxide, nitride and/or oxynitride. That is, the second interlayer dielectric layer 163 may be a single layer of material or may be a composite layer (i.e., multi-layered).

The second interlayer dielectric layer 163 covers the second electrode 160a. Furthermore, an upper contact plug 165 may extend through the second interlayer dielectric layer 163 and be connected to the second electrode 160a. In this case, the upper contact plug 165 is of conductive material. For example, the upper contact plug 165 is of a metal such as tungsten, copper or aluminum, a conductive metal nitride such as titanium nitride or tantalum nitride, a transition metal such as titanium or tantalum, and/or a metal-semiconductor compound such as a metal silicide.

An interconnection 170, such as a bit line, may be disposed on the second interlayer dielectric layer 163 as connected to the upper contact plug 165 and hence, to the magnetic memory element. The interconnection 170 is also of conductive material. For example, the interconnection 170 is of a metal such as tungsten, copper or aluminum, a conductive metal nitride such as titanium nitride or tantalum nitride, a transition metal such as titanium or tantalum, and/or a metal-semiconductor compound such as a metal silicide.

In another example, the second interlayer dielectric layer 163 is planarized such that the top surface of the second interlayer dielectric layer 163 is substantially coextensive with the top surface of the second electrode 160a. In this case, the upper contact plug 165 is omitted, and the interconnection 170 is disposed in contact with the second electrode 160a.

Returning now to the description of the magnetic memory element, the magnetic pattern 140a is formed of ferromagnetic material such as a compound including at least one of cobalt (Co), iron (Fe) and nickel (Ni). For example, the magnetic pattern 140a may comprise CoFeB, CoFe and/or CoFeNi. Thus, the magnetic pattern 140a may have an easy axis extending in a plane parallel with the surface (for example, the bottom surface) of the magnetic pattern 140a which is adjacent to the tunnel barrier pattern 135a. The direction of the easy axis in this embodiment is the direction of the x-axis in FIG. 1A. The magnetic pattern 140a also has a hard axis which extends perpendicular to the direction of the easy axis and also parallel to the bottom surface of the magnetic pattern 140a. The direction of the hard axis is the direction of a y-axis (not shown) which is perpendicular to the x-axis and z-axis shown in FIG. 1A. In plan, the magnetic pattern 140a may be rectangular with the direction of the easy axis parallel to the lengthwise direction of the rectangular shape and the direction of the hard axis parallel to the widthwise direction.

As was mentioned above, at least one perpendicular magnetic segment 150 is disposed within the magnetic pattern 140a. The perpendicular magnetic segment 150 is a body of magnetic material whose direction of magnetization has at least a component thereof lying in a plane perpendicular to the magnetization direction 145 of the magnetic pattern 140a. For ease of description, reference may be made to one such magnetic segment even though several of such segments may be provided in the magnetic pattern 140a as shown in the drawings.

Figure 1B:
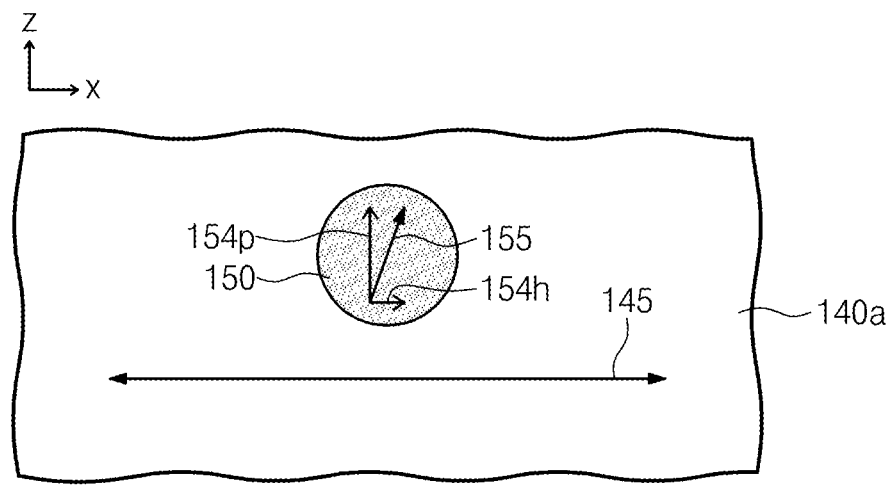
FIG. 1B is an enlarged view of one example of a magnetic pattern of the magnetic memory device of FIG. 1A.

In the example shown in FIGS. 1A and 1B, the magnetization direction 155 of the perpendicular magnetic segment 150 lies within a plane that is oblique with respect to the magnetization direction 145 of the magnetic pattern 140a. Thus, the magnetization direction 155 of the perpendicular magnetic section 150 may be resolved into two vector components, namely a first magnetization component 154p lying in a plane perpendicular to the plane of the magnetization direction 145 of the magnetic pattern 140a and a second magnetization component 154h lying in a plane parallel to the plane of the magnetization direction 145 of the magnetic pattern 140a. In the example shown in FIG. 1B, the first magnetization component 154p is parallel to the z-axis but the inventive concept is not so limited. That is, the first magnetization component 154p may be anti-parallel (skewed relative) to the z-axis.

The direction of magnetization of another example of the perpendicular magnetic segment 150 of a magnetic memory device according the inventive concept will be described with reference to FIG. 1C.

Figure 1C:
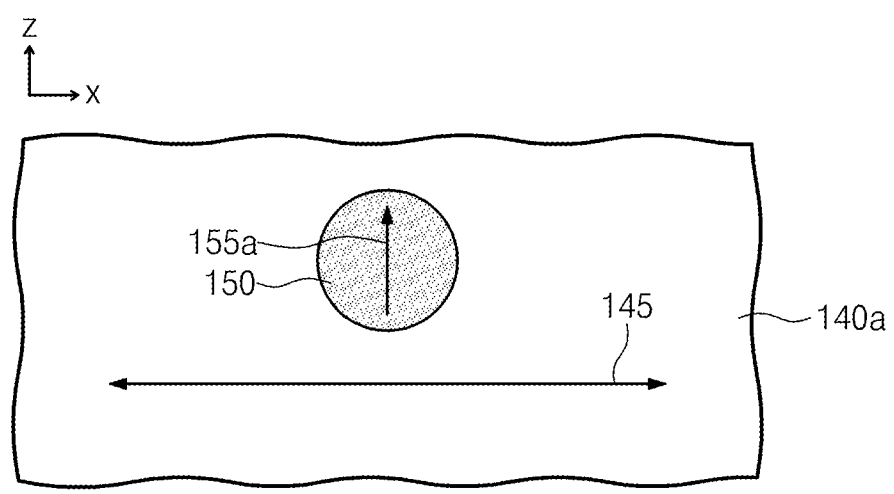
FIG. 1C is an enlarged view of another example of a magnetic pattern of the magnetic memory device of FIG. 1A.

Referring to FIGS. 1A and 1C, in this example, the magnetization direction 155a of the perpendicular magnetic segment 150 lies in a plane perpendicular to the magnetization direction 145 of the magnetic pattern 140a. That is, the magnetization direction 155a of the perpendicular magnetic section 150 does not have any component parallel to the magnetization direction 145 of the magnetic pattern 140a. Also, FIG. 1C shows an example in which the magnetization direction 155a of the perpendicular magnetic segment 150 is parallel to the z-axis. However, in another example, the magnetization direction 155a of the perpendicular magnetic segment 150 is anti-parallel to the z-axis.

In the embodiment of FIG. 1A, the magnetic material of the perpendicular magnetic segment 150 is a compound containing at least one lanthanoid. In one example, the perpendicular magnetic segment 150 is a compound containing at least one of lanthanoid and at least one element constituting the magnetic pattern 140. For example, the magnetic material of the perpendicular magnetic segment 150 may be XCo, XFeB, XCoFe, and/or XFe (wherein X is a lanthanoid). More specifically, the perpendicular magnetic segment 150 may be of at least one material selected from the group consisting of samarium-cobalt (SmCo), neodymium-iron-boron (NdFeB), gadolinium-iron (GdFe), gadolinium-cobalt (GdCo), gadolinium-cobalt-iron (GdCoFe), terbium-iron (TbFe), terbium-cobalt (TbCo), terbium-cobalt-iron (TbCoFe), dysprosium-iron (DyFe), dysprosium-cobalt (DyCo) and dysprosium-cobalt-iron (DyCoFe). Furthermore, the magnetic material of the perpendicular magnetic segment 150 may be in amorphous state within the magnetic pattern 140a.

Also, at least some of the perpendicular magnetic segments 150 inside the magnetic pattern 140a may be disposed at substantially the same level, i.e., at substantially the same distance from the top surface of the substrate 100. FIG. 1A shows an example in which the perpendicular magnetic segments 150 are arranged in two layers above the substrate 100 such that the perpendicular magnetic segments 150 are disposed at two different levels above the substrate 100. Alternatively, the perpendicular magnetic segments 150 may be disposed randomly within the magnetic pattern 140a.

Referring once again to FIG. 1A, the reference pattern 130a of this embodiment includes a pinning pattern 113a, and a main pinned pattern 125a interposed between the pinning pattern 113a and the tunnel barrier pattern 135a. In addition, and as shown in the drawing, the reference pattern 130a may include an assistant pinned pattern 115a and an exchange coupling pattern 120a. In this case, the assistant pinned pattern 115a is interposed between the pinning pattern 113a and the main pinned pattern 125a, and the exchange coupling pattern 120a is interposed between the main pinned pattern 125a and the assistant pinned pattern 115a.

The magnetization direction 117 of the assistant pinned pattern 115a is fixed by the pinning pattern 113a. The magnetization direction 127 of the main pinned pattern 125a is exchange-coupled by the exchange coupling pattern 120a with the magnetization direction 117 of the assistant pinned pattern 115a, in such a way that the magnetization direction 127 of the main pinned pattern 125a is anti-parallel to the magnetization direction 117 of the assistant pinned pattern 115a. Thus, the magnetization direction 127 of the main pinned pattern 125a is fixed in one direction by the pinning pattern 113a, the assistant pinned pattern 115a and the exchange coupling pattern 120a.

Also, the main pinned pattern 125a is disposed adjacent to the tunnel barrier pattern 135a. Therefore, the magnetization direction 127 of the main pinned pattern 125a constitutes the fixed direction of magnetization of the reference pattern 130a of the magnetic memory element.

In another example of the embodiment of FIG. 1A, the assistant pinned pattern 115a and the exchange coupling pattern 120a are omitted, and the main pinned pattern 125a contacts the pinning pattern 113a.

The pinning pattern 113a is of anti-ferromagnetic material. It is a characteristic of anti-ferromagnetic material that it pins or fixes the magnetization direction of magnetic material (the magnetization direction 117 of the assistant pinned pattern 115a in this case). For example, the pinning pattern 113a may be of at least one material selected from the group consisting of platinum-manganese (PtMn), iridium-manganese (IrMn), manganese oxide (MnO), manganese sulfide (MnS), manganese-tellurium (MnTe) and manganese fluoride (MnF). On the other hand, the main pinned pattern 125a is of ferromagnetic material. For example, the main pinned pattern 125a is of at least one material selected from the group consisting of cobalt-iron-boron (CoFeB), cobalt-iron (CoFe), nickel-iron (NiFe), cobalt-iron-platinum (CoFePt), cobalt-iron-palladium (CoFePd), cobalt-iron-chromium (CoFeCr), cobalt-iron-terbium (CoFeTb), and cobalt-iron-nickel (CoFeNi). The assistant pinned pattern 115a, when employed as in the illustrated embodiment, is also of ferromagnetic material. For example, the assistant pinned pattern 115a is of at least one material selected from the group consisting of cobalt-iron-boron (CoFeB), cobalt-iron (CoFe), nickel-iron (NiFe), cobalt-iron-platinum (CoFePt), cobalt-iron-palladium (CoFePd), cobalt-iron-chromium (CoFeCr), cobalt-iron-terbium (CoFeTb), and cobalt-iron-nickel (CoFeNi). Also, in this example, the exchange coupling pattern 120a is of at least one material selected from the group consisting of ruthenium (Ru), iridium (Ir) and rhodium (Rh).

The tunnel barrier pattern 135a is a layer of dielectric material. For example, the tunnel barrier pattern 125a may be of at least one material selected from the group consisting of magnesium oxide, titanium oxide, aluminum oxide, magnesium-zinc oxide and magnesium-boron oxide. Also, the tunnel barrier pattern 135a is formed to be thinner than what is known as the spin diffusion distance.

The first electrode 110a is preferably of conductive material having a low reactivity. For example, the first electrode 110a may be formed of a metal nitride such as titanium nitride, tantalum nitride or tungsten nitride. The second electrode 160a is also preferably of conductive material having a low reactivity. For example, the second electrode 160a may be formed of a metal nitride such as titanium nitride, tantalum nitride or tungsten nitride. In addition, the second electrode 160a adjacent to the magnetic pattern 140 may be multi-layered. For example, the second electrode 160a may be formed of a passivation layer and a conductive metal nitride stacked on the passivation layer. In this case, the passivation layer may be of at least one material selected from the group consisting of tantalum, palladium, titanium, platinum, silver, gold, ruthenium and copper.

The theory of operation of the magnetic memory device will now be described. The magnetization direction 145 of the magnetic pattern 140a can be changed by spin transfer (torque) of electrons in program current passing through the magnetic memory element. For example, in the case in which the magnetization direction 145 of the magnetic pattern 140a is anti-parallel to the magnetization direction 127 of the reference pattern 130a, program current can be directed toward the reference pattern 130a from the magnetic pattern 140a, electrons in the program current flow toward the magnetic pattern 140a from the reference pattern 130a. The program current is polarized by the reference pattern 130a such that the majority electrons of the program current have spins parallel with the magnetization direction 127 of the reference pattern 130a, whereas minority electrons of the program current have spins anti-parallel to the magnetization direction 127 of the reference pattern 130a. As a result of the spin of the majority electrons, the magnetization direction 145 of the magnetic pattern 140a can be changed to be parallel to the magnetization direction 127 of the reference pattern 130a. In this case, the magnetic pattern 140a assumes a first logic state, for example, based on the value of its resistance, i.e., stores given data.

On the other hand, in the case in which the magnetization direction 145 of the magnetic pattern 140a is parallel to the magnetization direction 127 of the reference pattern 130a, a program current can be directed from the reference pattern 130a toward the magnetic pattern 140a. In this case, electrons in the program current flow toward the reference pattern 130a from the magnetic pattern 140a with their spins established by the direction of magnetization 145 of the magnetic pattern 140a. Among the electrons in the program current, the majority electrons are transmitted by the reference pattern 130a. However, the minority electrons are reflected due to the magnetization direction 127 of the reference pattern 130a. The reflected minority electrons return to the magnetic pattern 140a and change the magnetization direction 145 of the magnetic pattern 140a so as to be anti-parallel to the magnetization direction 127 of the reference pattern 130a. In this case, the magnetic pattern 140a assumes a second logic state, for example, different from the first logic state.

The minimum current density capable of changing the magnetization direction 145 of the magnetic pattern 140a is designated as the 'critical current density'. The critical current density of the magnetic pattern 140a is in effect decreased by the perpendicular magnetic segment(s) 150 according to the inventive concept. In particular, the critical current density of the magnetic pattern 140a is in effect decreased and the data retention characteristic of the magnetic pattern 140a is improved due to the perpendicular magnetic segment(s) 150. Accordingly, the critical current density of the magnetic pattern 140a may be made relatively low without the need to reduce the thickness of the magnetic pattern 140a and/or lower its saturation magnetization.

Therefore, the magnetic memory device may consume a relatively low amount of power while possessing a high degree of reliability.

As described above, the perpendicular magnetic segments 150 are disposed inside the magnetic pattern 140a. This will be described in further detail with reference to examples shown in FIGS. 1D and 1E.

Figure 1D:
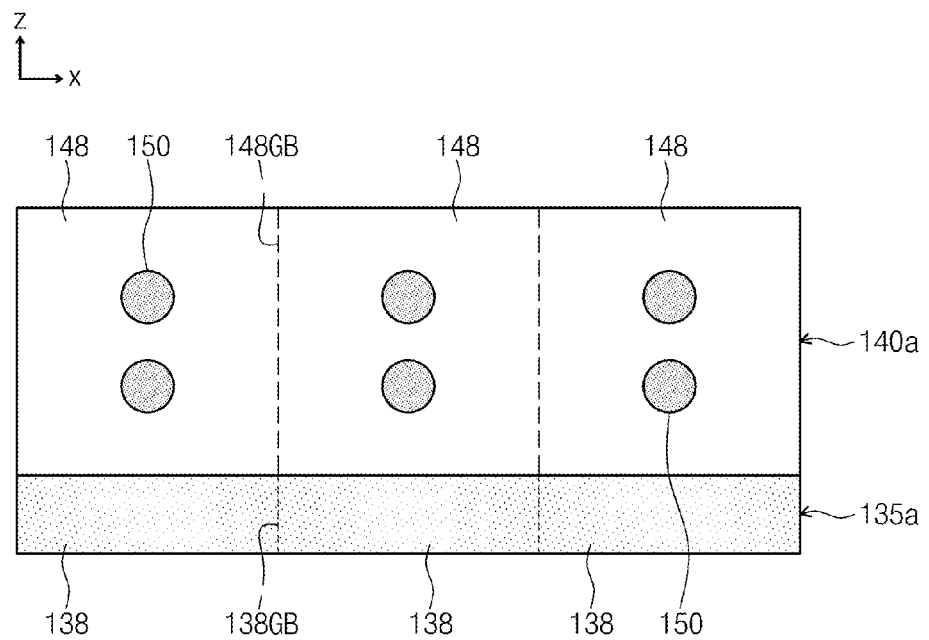
FIG. 1D is an enlarged cross-sectional view of the tunnel barrier pattern, the magnetic pattern and perpendicular magnetic segments of one example of the magnetic memory device of FIG. 1A.

In the example shown in FIG. 1D, the entire magnetic pattern 140a is made up of a plurality of grains 148 defining boundaries 148GB therebetween (grain boundaries), i.e., the entire magnetic pattern 140a is in a polycrystalline state. The perpendicular magnetic segments 150 are disposed inside the grains 148. Thus, each part (grain 148) of magnetic pattern 140a surrounding and adjacent to a perpendicular magnetic segment 150 is in a single crystalline state.

The tunnel barrier pattern 135 may also be in a polycrystalline state constituted by a plurality of grains 138 defining boundaries 138GB therebetween. The grains 148 of the magnetic pattern 140a may be grown from the grains 138 of the tunnel barrier pattern 135 as seeds. In particular, the grains 148 of the magnetic pattern 140a may be grown in the [001] crystal direction.

Figure 1E:
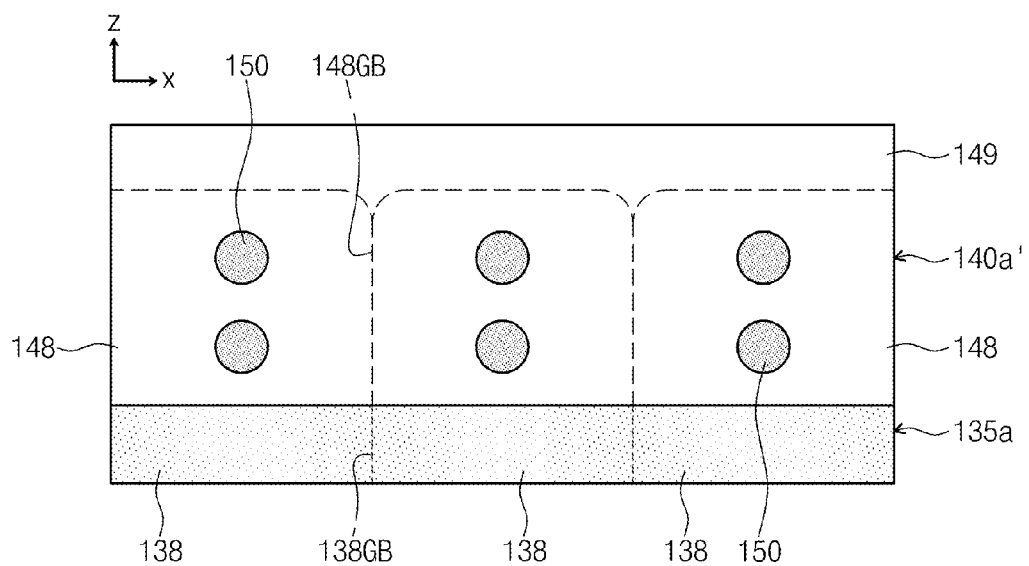
FIG. 1E is an enlarged cross-sectional view of the tunnel barrier pattern, the magnetic pattern and perpendicular magnetic segments of another example of the magnetic memory device of FIG. 1A.

In the example shown in FIG. 1E, a first part of the magnetic pattern 140a' is in a polycrystalline state, a second part 149 of the magnetic pattern 140a' is in an amorphous state, and the second part 149 of the magnetic pattern 140a' is disposed on the first part in the crystalline state. Thus, the grains 148 of the magnetic pattern 140a' are disposed between the second part 149 of the magnetic pattern 140a' and the tunnel barrier pattern 135a. Similarly to the example described above, the perpendicular magnetic segments 150 are disposed inside the grains 148 of the magnetic pattern 140a'. Also, the grains 148 of the magnetic pattern 140a' may be grown from grains 138 of the tunnel barrier pattern 135a as seeds.

Another example of the perpendicular magnetic section will be described with reference to FIGS. 2A and 2B. In this example, each perpendicular magnetic segment 150a extends along a boundary 148GB between grains 148 of the magnetic pattern 140a. In this respect, each perpendicular magnetic segment 150a may also have the shape of a length of string. Furthermore, the perpendicular magnetic segment 150a may extend along part of a boundary 148GB of the magnetic pattern 140a as spaced from tunnel barrier pattern 135a, as illustrated. Alternatively, the perpendicular magnetic segment 150a may contact the tunnel barrier pattern 135a. In any case, the direction of magnetization of each perpendicular magnetic segment 150a has at least one component that is not parallel to the direction of magnetization 127 of the reference pattern 130a (refer to the descriptions of FIGS. 1B and 1C.

Otherwise, this example may be embodied with any of the features and aspects described above in connection with FIGS. 1A-1E, e.g., with respect to materials and configurations. Therefore, a detailed description of such features and aspects of this example will be omitted for the sake of brevity.

Figure 3A:
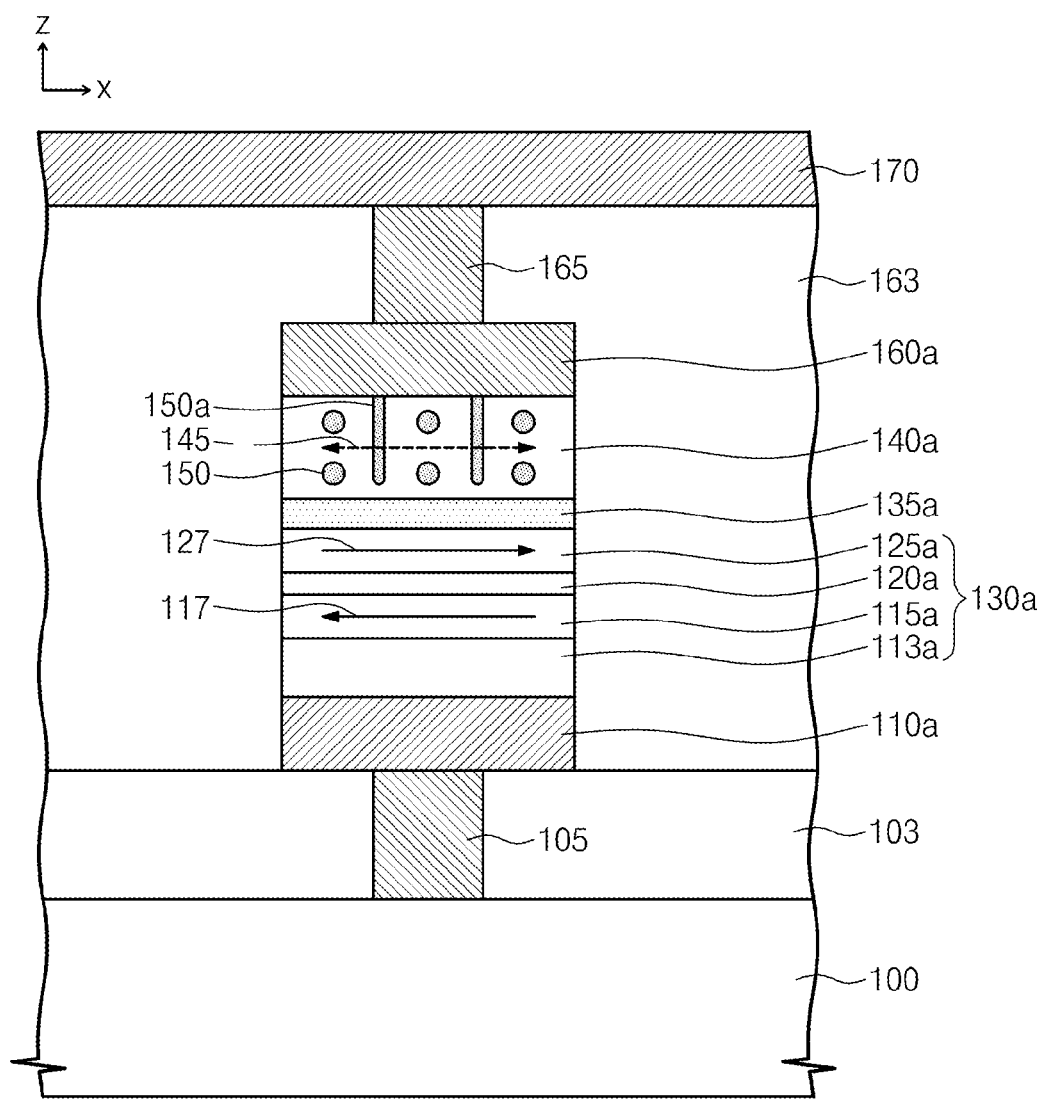
FIG. 3A is a cross-sectional view of yet another example of a magnetic memory device according to the inventive concept.
Figure 3B:
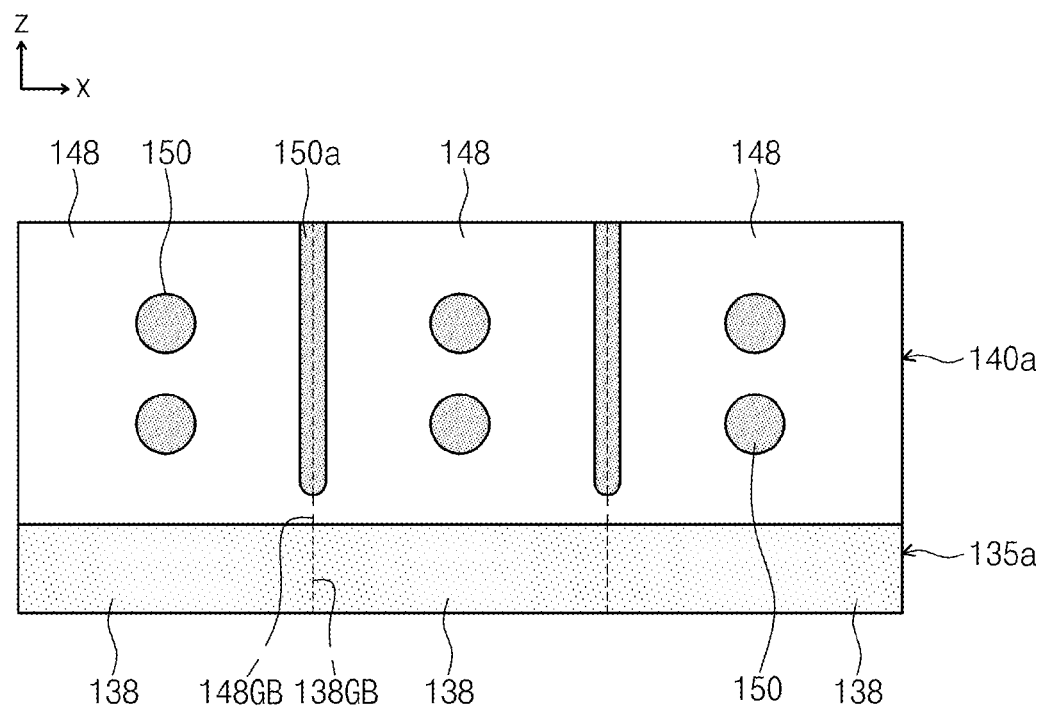
FIG. 3B is an enlarged cross-sectional view of an example of the tunnel barrier pattern, the magnetic pattern and the perpendicular magnetic segments of the magnetic memory device of FIG. 3A.

FIGS. 3A and 3B illustrate an example having a combination of features described above. That is, at least one of first perpendicular magnetic segment 150 and at least one second perpendicular magnetic segment 150a are disposed inside the magnetic pattern 140a. The first and the second perpendicular magnetic segments 150 and 150a may be of the same magnetic material. Otherwise, this example may be embodied as having any of the features and aspects already described.

Figure 4:
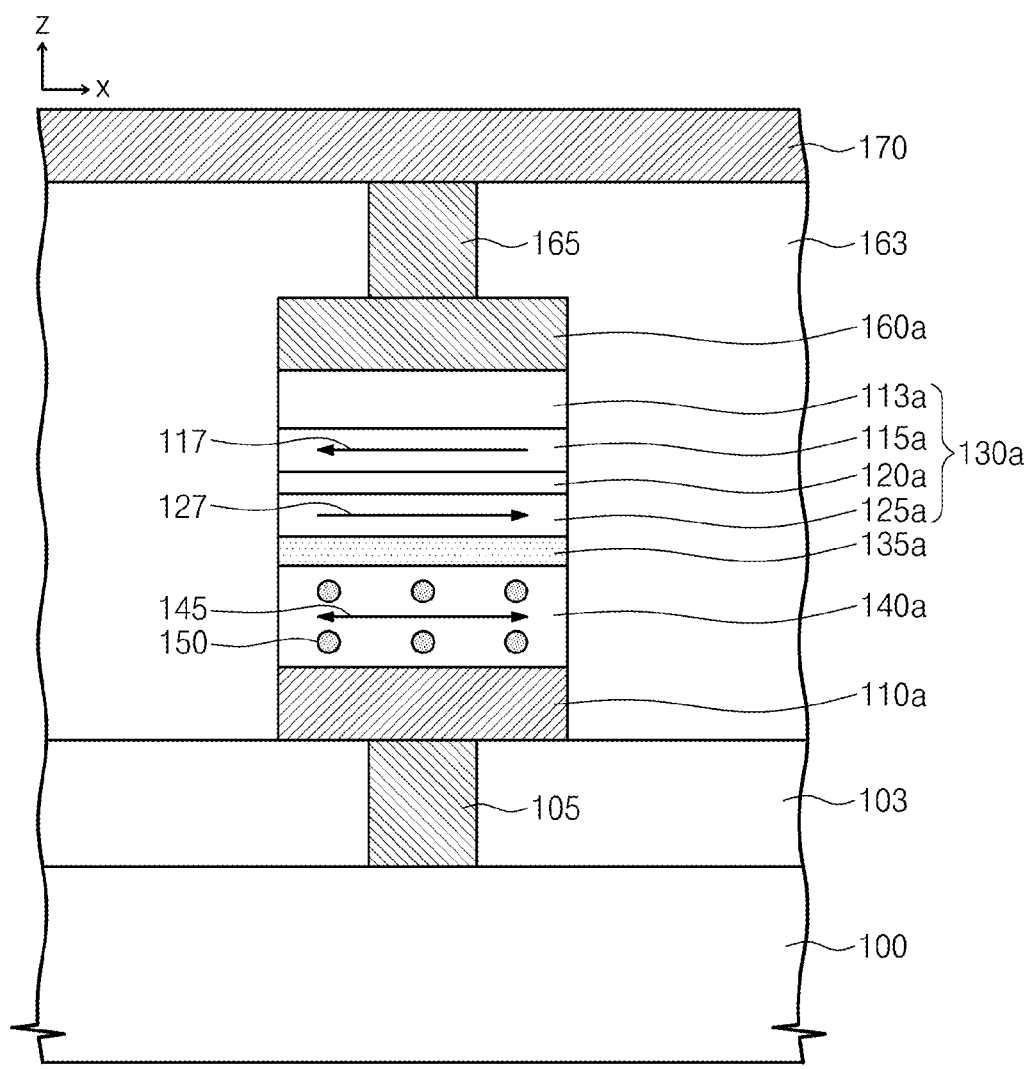
FIG. 4 is a cross-sectional view of still another example of a magnetic memory device according to the inventive concept.

FIG. 4 illustrates another example of the first embodiment in which the positions of the magnetic pattern 140a and the reference pattern 130a are reversed with respect to the tunnel barrier pattern 135a.

That is, in this example, the magnetic pattern 140a is disposed directly on the first electrode 110a, and the surface of the magnetic pattern 140a that is adjacent to the tunnel barrier pattern 135a is the top surface of the magnetic pattern 140a. The main pinned pattern 125a of the reference pattern 130a is disposed directly on the tunnel barrier pattern 135a. The exchange coupling pattern 120a, assistant pinned pattern 115a and pinning pattern 113a are stacked in the foregoing sequence on the main pinned pattern 125a.

Also, in this example, the first electrode 110a may be in a crystalline state. In this case, grains of the magnetic pattern 140a may be grown from grains of the first electrode 110a as seeds.

Otherwise, this example may be embodied as having any of the features and aspects described above, such perpendicular magnetic segment(s) having a direction of magnetization as shown in and described in connection with FIG. 1B or 1C, perpendicular magnetic segment(s) 150a as shown in and described in connection with FIGS. 2A and 2B, or first and second perpendicular magnetic segments 150 and 150a as shown in and described in connection with FIGS. 3A and 3B.

Figure 5:
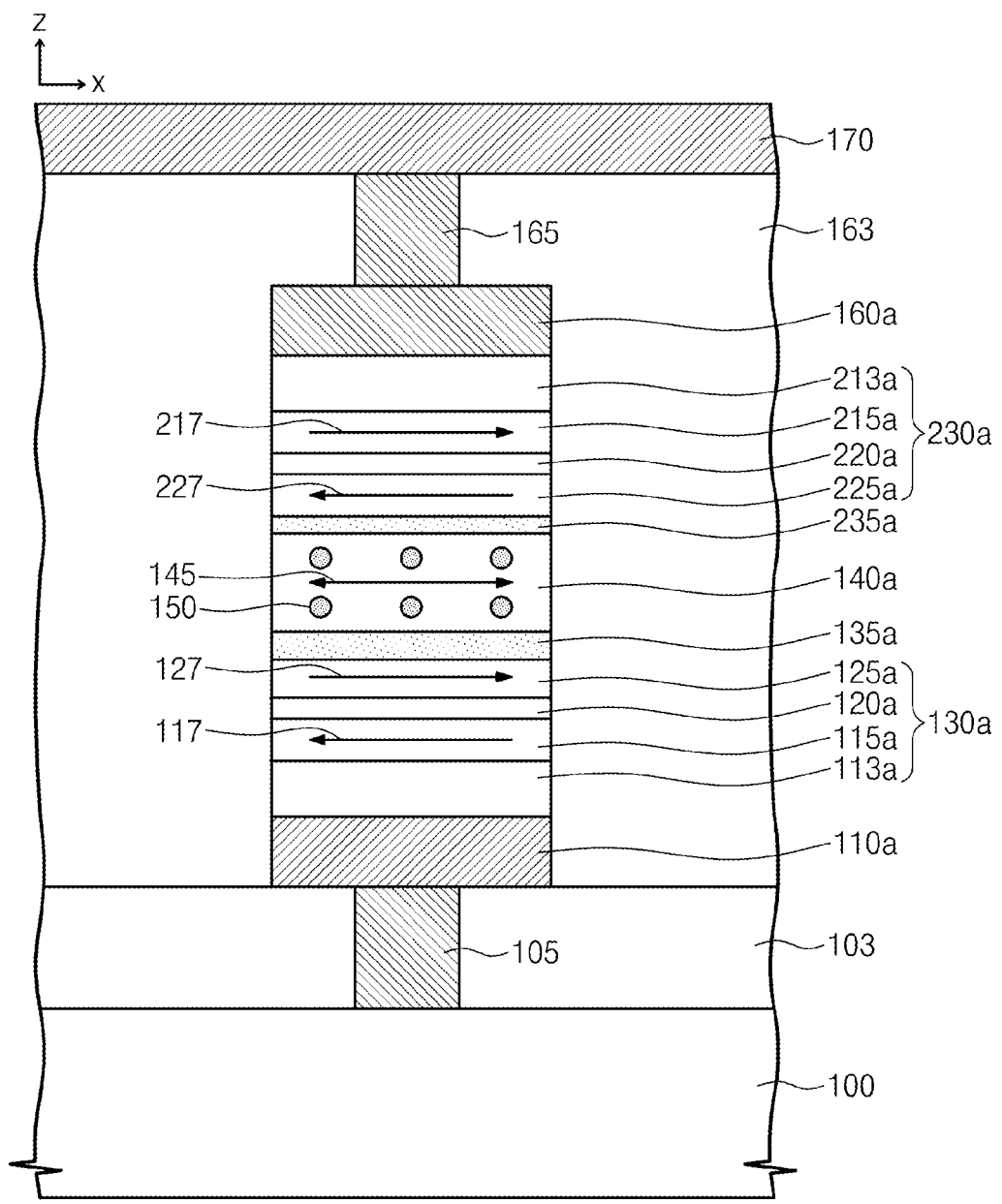
FIG. 5 is a cross-sectional view of another embodiment of a magnetic memory device according to the inventive concept.

FIG. 5 illustrates another embodiment of a magnetic memory device according to the inventive concept.

Referring to FIG. 5, this embodiment of a magnetic memory device includes first electrode 110a disposed on first interlayer dielectric layer 103, and a first reference pattern 130a, a first tunnel barrier pattern 135a, a magnetic pattern 140a, a second tunnel barrier pattern 235a and a second reference pattern 230a stacked in the foregoing sequence on the first electrode 110a. Thus, the magnetic pattern 140a is interposed between the first reference pattern 130a and the second reference pattern 230a, the first tunnel barrier pattern 135a is interposed between the first reference pattern 130a and the magnetic pattern 140a, and the second tunnel barrier pattern 135a is interposed between the second reference pattern 230a and the magnetic pattern 140a. Second electrode 160a is disposed on the second reference pattern 230a. Furthermore, at least one perpendicular magnetic segment 150 is disposed inside the magnetic pattern 140a.

The first reference pattern 130a, in this example, includes a first pinning pattern 113a, a first assistant pinned pattern 115a, a first exchange-coupling pattern 120a and a first main pinned pattern 125a which stacked in the foregoing sequence on the first electrode 110a. The magnetization direction 127 of the first main pinned pattern 125a constitutes the fixed magnetization direction 127 of the first reference pattern 130a. The second reference pattern 230a, in this example, includes a second main pinned pattern 225a, a second exchange coupling pattern 220a, a second assistant pinned pattern 215a and a second pinning pattern 213a which are stacked in the foregoing sequence on the second tunnel barrier pattern 235a. The magnetization direction 217 of the assistant pinned pattern 215a is fixed by the second pinning pattern 213a. The magnetization direction 227 of the second main pinned pattern 225a is exchange-coupled with the magnetization direction 217 of the second assistant pinned pattern 215a so that they are anti-parallel. The magnetization direction 227 of the second main pinned pattern 215a adjacent to the second tunnel barrier pattern 235a constitutes the fixed magnetization direction 227 of the second reference pattern 230a.

Accordingly, the magnetic memory element of this embodiment comprises the first reference pattern 130a, the first tunnel barrier pattern 135a, the magnetic pattern 140a, the perpendicular magnetic section 150, the second tunnel barrier pattern 235a and the second reference pattern 230a, in which the fixed magnetization direction 127 of the first reference pattern 130a is anti-parallel with the fixed magnetization direction 227 of the second reference pattern 230a.

The second pinning pattern 213a is of anti-ferromagnetic material. The anti-ferromagnetic material in the first pinning pattern 113a has a first blocking temperature, and the anti-ferromagnetic material of the second pinning pattern 113a has a second blocking temperature. Blocking temperature refers to the temperature at which the anti-ferromagnetic material is unable to pin the magnetization direction of magnetic material.

The first blocking temperature (blocking temperature of the first pinning pattern 213a) is different from the second blocking temperature (blocking temperature of the second pinning pattern 213a) so that the magnetic memory element can be heated to a temperature between the first and the second blocking temperatures, and an exterior magnetic field may be used to make the magnetization directions 127 and 227 of the first and the second reference patterns 130a and 230a anti-parallel with respect to each other. To this end, one of the first and the second pinning patterns 113a and 213a may comprise iridium manganese (IrMn) and the other may comprise platinum manganese (PtMn), for example.

The second main and assistant pinned patterns 225a and 215a are of ferromagnetic material. For example, the second main and assistant pinned patterns 225a and 215a may be of at least one material selected from the group consisting of cobalt iron boron (CoFeB), cobalt iron (CoFe), nickel iron (NiFe), cobalt iron platinum (CoFePt), cobalt iron palladium (CoFePd), cobalt iron chromium (CoFeCr), cobalt iron terbium (CoFeTb) and cobalt iron nickel (CoFeNi). The second exchange-coupling pattern 220a may be of at least one material selected from the group consisting of ruthenium (Ru), iridium (Ir) and rhodium (Rh).

According to an aspect of this embodiment, the value of the resistance (first resistance value) between the bottom and top surfaces of the first tunnel barrier pattern 135a can be different from the value of the resistance (second resistance value) between the bottom and top surfaces of the second tunnel barrier pattern 235a. To this end, the thickness of the first tunnel barrier pattern 135a may be different from that if the second tunnel barrier pattern 235a and/or the resistivity of the dielectric material of the first tunnel barrier pattern 135a may be different from the resistivity of the dielectric material of the first tunnel barrier pattern 235a. In this respect, the second tunnel barrier pattern 235a may be of at least one material selected form the group consisting of magnesium oxide, titanium oxide, aluminum oxide, magnesium zinc oxide and magnesium boron oxide.

The difference between the first resistance value and the second resistance value allows the logic state of the magnetic memory element to be determined, i.e., allows for different data to be stored/recorded. For example, in the case in which the first resistance value is larger than the second resistance value, the ratio of magneto resistance between the first reference pattern 130a and the magnetic pattern 140a is larger than the ratio of magneto resistance between the magnetic pattern 140a and the second reference pattern 230a. Therefore, the logic state of the magnetic memory element may be determined by the relationship (parallel or anti-parallel) between the magnetization direction 145 of the magnetic pattern 140a and the fixed magnetization direction 127 of the first reference pattern 130a.

On the contrary, in the case in which the first resistance value is smaller than the second resistance value, the logic state of the magnetic memory element is determined by the relationship between the magnetization direction 145 of the magnetic pattern 140a and the second fixed magnetization direction 227 of the second reference pattern 230a.

The theory behind the operation of an embodiment of a magnetic memory device of FIG. 5 will be described. In the case in which electrons in the program current are flowing toward the second reference pattern 230a from the first reference pattern 130a, electrons having spin parallel to the first fixed magnetization direction 127 of the first reference pattern 130a are transmitted by the magnetic pattern 140a. At the same time, electrons having spin anti-parallel with respect to the fixed magnetization direction 227 of the second reference pattern 230a are reflected back to the magnetic pattern 140a. Therefore, the magnetization direction 145 of the magnetic pattern 140a is changed so as to be parallel to the first fixed magnetization direction 127. The transfer of spin (magnetic torque or angular momentum) to the magnetic pattern 140a is relatively great due to the electrons of the program current whose spin is parallel to the first fixed magnetization direction 127 of the first reference pattern 130a and the electrons reflected by the second reference pattern 230a. Therefore, the critical current density of the magnetic pattern 140a is correspondingly low. As a result, magnetic memory devices with relatively low power consumption can be realized.

On the other hand, in the case in which electrons in the program current are flowing toward the first reference pattern 130a from the second reference pattern 230a, electrons having spin parallel to the fixed magnetization direction 227 of the second reference pattern 230a are transmitted by the magnetic pattern 140a. At the same time, electrons (having spin anti-parallel relative to the first fixed magnetization direction 127) are reflected by the first reference pattern 130a back to the magnetic pattern 140a. The reflected electrons have spin parallel to the fixed magnetization direction 227. Thus, the magnetization direction 145 of the magnetic pattern 140a can be changed to be parallel to the fixed magnetization direction 227 of the second reference pattern 230a.

As was the case with the example of FIG. 4, the magnetic memory element of the embodiment of FIG. 5 may have at least one perpendicular magnetic segment 150 as shown in and described with reference to FIG. 1B or 1C in the magnetic pattern 140a, at least one perpendicular segment 150a as shown in and described with reference to FIGS. 2A and 2B, or first and second perpendicular magnetic segments 150 and 150a as shown in and described with reference to FIGS. 3A and 3B.

Figure 6:
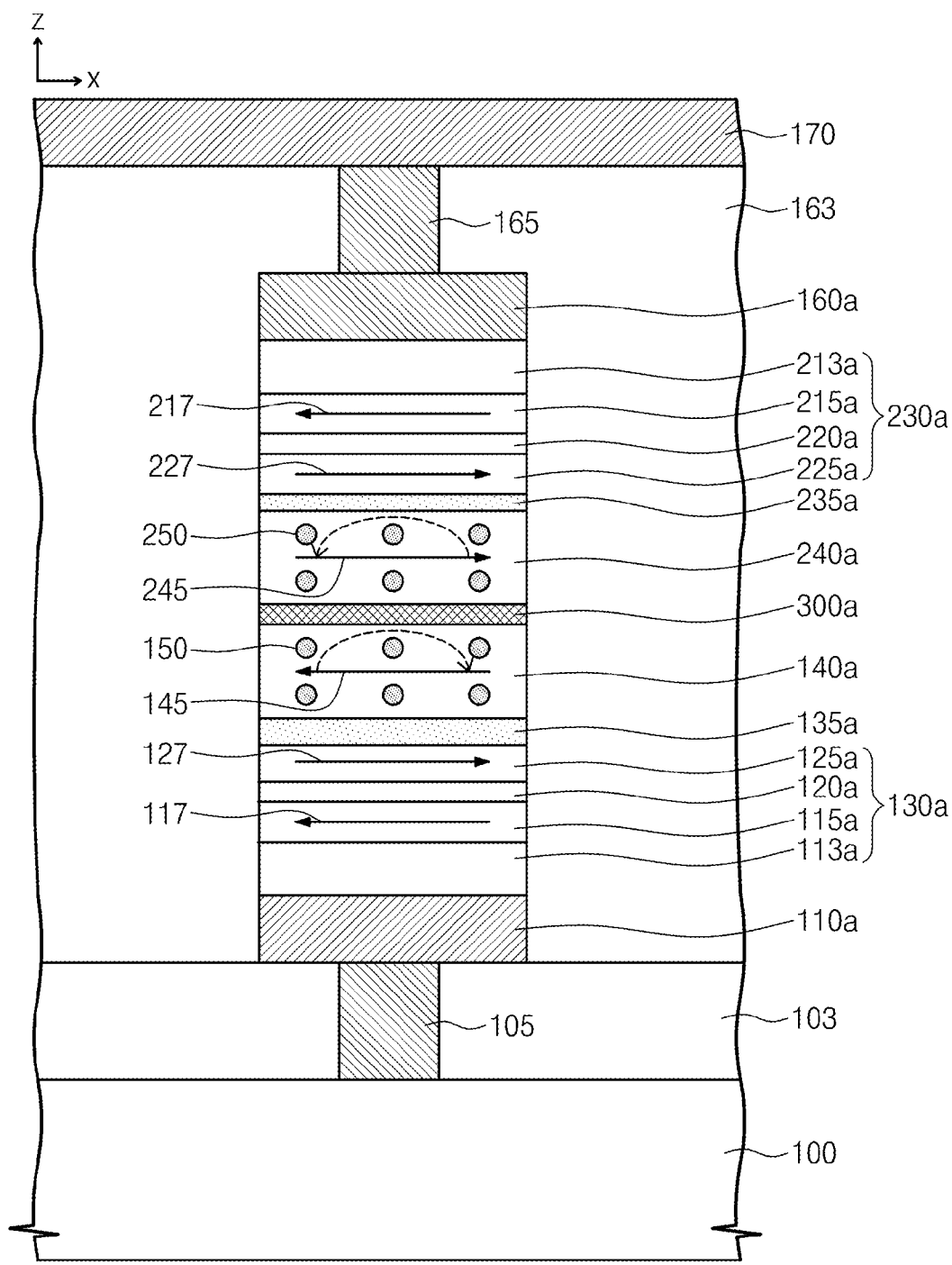
FIG. 6 is a cross-sectional view of still another embodiment of a magnetic memory device according to the inventive concept.

An example of the second embodiment, according to the inventive concept, in which the magnetic memory element has a pair of magnetic patterns will now be described with reference to FIG. 6.

In this example, first magnetic pattern 140a and a second magnetic pattern 240a are disposed between first tunnel barrier pattern 135a and second tunnel barrier pattern 235a. An interlayer pattern 300a is interposed between the first magnetic pattern 140a and the second magnetic pattern 240a. The first tunnel barrier pattern 135a, the first magnetic pattern 140a, the interlayer pattern 300a and the second magnetic pattern 240a are thus interposed between the first reference pattern 130a and the second reference pattern 230a.

The second magnetic pattern 240a comprises ferromagnetic material. For example, the second magnetic pattern 240a is of CoFeB, CoFe and/or CoFeNi. The interlayer pattern 300a is of at least one material selected from the group consisting of tantalum, palladium, titanium, platinum, silver, gold, copper, ruthenium, iridium and rhodium.

The perpendicular magnet segment(s) in the first magnetic pattern 140a and/or the second magnetic pattern 240a can have any of the forms described in detail above with reference to FIGS. 1B and 1C, FIGS. 2A and 2B, or FIGS. 3B and 3B.

The magnetization direction 245 of the second magnetic pattern 240a is changeable. Also, the second magnetic pattern 240a and the first magnetic pattern 140a are exchange-coupled so that the magnetization direction 245 of the second magnetic pattern 240a remains anti-parallel to the magnetization direction 145 of the first magnetic pattern 140a. More specifically, the first and the second magnetic patterns 140a and 240a produce a magneto static field or stray field. In addition, in this example, the first and the second magnetic patterns 140a and 240a are exchange-coupled to each other by the interlayer pattern 300a. The interlayer pattern 300a is of ruthenium, iridium or rhodium, for example. As a result, the magneto static field or stray field causes the magnetization direction 245 of the second magnetic pattern 240a to be anti-parallel to the magnetization direction 145 of the first magnetic pattern 140a.

Accordingly, if the magnetization direction 145 of the first magnetic pattern 140a is parallel to the first fixed magnetization direction 127 of the first reference pattern 130a, the magnetization direction 245 of the second magnetic pattern 240a is anti-parallel to the first magnetization direction 127. If the magnetization direction 145 of the first magnetic pattern 140a is changed to be anti-parallel to the first fixed magnetization direction 127, the magnetization direction 245 of the second magnetic pattern 140a is changed, by virtue of the exchange coupling, to be anti-parallel to the magnetization direction 145 of the first magnetic pattern 140a.

At least one perpendicular magnetic segment 150 is disposed inside the first magnetic pattern 140a. At least one perpendicular magnetic segment 250 is disposed inside the second magnetic pattern 240a. The perpendicular magnetic segments 150 and 250 inside the first and the second magnetic patterns 140a and 240a may be of the same material. In any case, the direction of magnetization of each perpendicular magnetic segment 250 inside the second magnetic pattern 240a has a magnetic component perpendicular to the magnetization direction 245 of the second magnetic pattern 240a. Therefore, the critical current density of the second magnetic pattern 240a is, in effect, reduced by the perpendicular magnetic segment(s) 250.

According to this example, the magnetic memory element has the first and second reference patterns 130a and 230a, the first and second barrier patterns 135a and 235a, the first and second magnetic patterns 140a and 240a, the perpendicular magnetization segments 150 and 250 and the interlayer pattern 300a. The fixed magnetization direction 127 of the first reference pattern 130a (first magnetization direction) is parallel to the fixed magnetization direction 227 of the second reference pattern 230a (second magnetization direction). An external magnetic field is applied after the temperature of the element (specifically, the first and the second pinning patterns 113a and 213a of the element) is raised to a level above the respective blocking temperatures of the first and the second pinning patterns 113a and 213a such that the first and the second fixed magnetization directions 127 and 227 are parallel.

A program operation of the magnetic memory device shown in FIG. 6 will now be described in detail. When the magnetization direction 145 of the first magnetic pattern 140a is anti-parallel to the fixed magnetization direction 127 of the first reference pattern 130a, electrons in the program current flow toward the second reference pattern 230a from the first reference pattern 130a. The electrons passing through the first reference pattern 130a include majority electrons having spin parallel to the first fixed magnetization direction 127, and minority electrons having spin anti-parallel to the first fixed magnetization direction 127. The majority electrons are transmitted by the first magnetic pattern 140a. The magnetization direction 145 of the first magnetic pattern 140a is changed to be parallel to the first fixed magnetization direction 127 by the majority electrons in the first magnetic pattern 140a. The magnetization direction 245 of the second magnetic pattern 240a changed while the magnetization direction 145 of the first magnetic pattern 140a is changed because the second magnetic pattern 240a is exchange coupled with the first magnetic pattern 140a. The minority electrons have spin anti-parallel to the second fixed magnetization direction 227 because the fixed magnetization directions 127 and 227 of the first and second reference pattern 130a and 230a are parallel to each other. Thus, the minority electrons are reflected by the second reference pattern 230a back to the second magnetic pattern 240a. The minority electrons transmitted by the second magnetic pattern 240a assist in inverting the magnetization direction of the second magnetic pattern 240a.

Therefore, the critical current density for inverting the magnetization direction of the first and the second magnetic patterns 140a and 240a is relatively low. In addition, the critical current density is also, in effect, decreased by the perpendicular magnetic segments 150 and 250. As a result, magnetic memory devices with minimized power consumption can be realized, and the magnetic memory devices can highly integrated while possessing superior reliability.

As described with reference to FIG. 5, the resistance value of the first tunnel barrier pattern 135a is different from the resistance value of the second tunnel barrier pattern 235a. Therefore, the ratio of magneto resistance between the first magnetic pattern 140a and the first reference pattern 130a is different from the ratio magneto-resistance between the second magnetic pattern 240a and the second reference pattern 230a. Therefore, the magnetic memory element can assume different logic states as data and thus, data can be recorded in or read from the element as by inducing a particular logic state in or sensing the logic state of the element.

Methods of fabricating magnetic memory devices, according to the inventive concept, will now be described. Because magnetic memory devices that can be formed by these methods have already been described in detail, some of the structures and features formed by the method will not be described in detail as reference may be made instead back to the description of prior figures.

A first method of forming magnetic memory devices of the type shown in FIGS. 1A-1E, for example, will be described with reference to FIGS. 7A-7D.

Figure 7A:
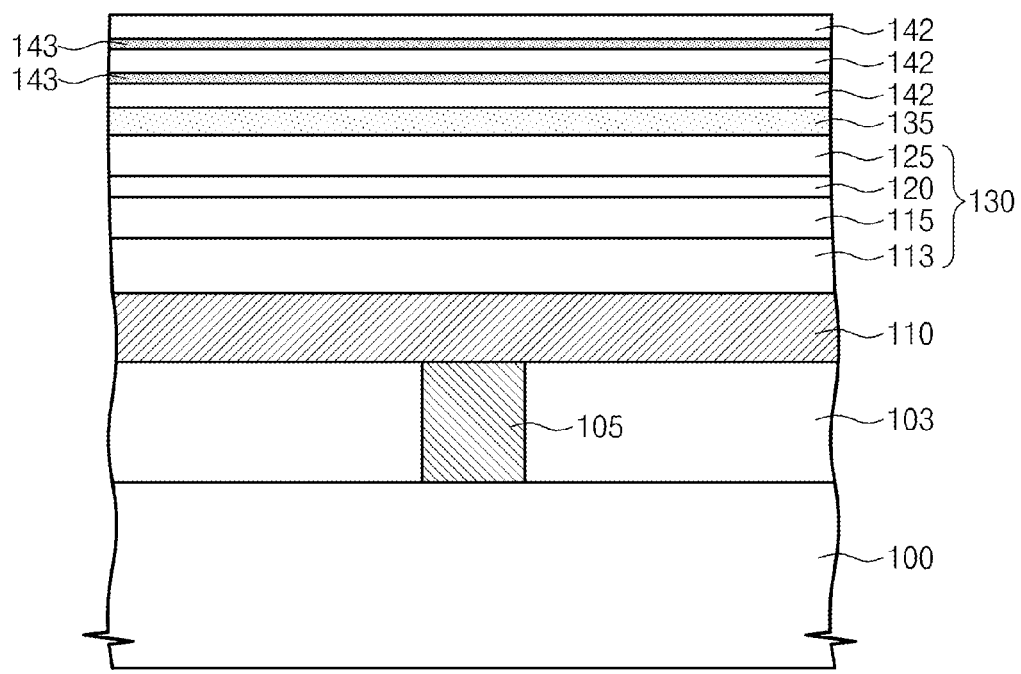
FIGS. 7A through 7D are cross-sectional views and together illustrate a method of fabricating a magnetic memory device according to the inventive concept.

Referring to FIG. 7A, a first interlayer dielectric layer 103 is formed on a substrate 100, and a lower contact plug 105 is formed through the first interlayer dielectric layer 103. A first electrode layer 110 is formed on the first interlayer dielectric layer 103. In the illustrated example, the first electrode layer 110 is formed in contact with the lower contact plug 105.

A reference layer 130 and a tunnel barrier layer 135 are sequentially formed on the first electrode layer 110. The reference layer 130 may be formed by sequentially forming a pinning layer 113, an assistant pinned layer 115, an exchange coupling layer 120 and a main pinned layer 125 one atop the other. Each of the pinning layer 113, the assistant pinned layer 115, the exchange coupling layer 120 and the main pinned layer 125 are formed by sputtering (sputter deposition) in this example, although other processes may be used instead. For example, each of the layers 113, 115, 120 and 125 may be formed by a chemical vapor deposition (CVD) process or an atomic layer deposition (ALD) process. The tunnel barrier layer 135 may be formed by sputtering, CVD or ALD. Also, in this example, the tunnel barrier layer 135 is formed in crystalline state as described with reference to FIG. 1B.

A multi-layered structure is then formed on the tunnel barrier layer 135. The multi-layered structure in this example includes alternately disposed sub-magnetic 142 and lanthanoid 143 layers. In this case, the uppermost layer of the multi-layered structure is a sub-magnetic layer 142. The detailed description below of the sub-magnetic 142 and lanthanoid 143 layers will refer to each sub-magnetic layer 142 or lanthanoid layer 143.

The sub-magnetic layer 142 is formed of ferromagnetic material. For example, the sub-magnetic layer 142 may be of CoFeB, CoFe and/or CoFeNi. Also, the sub-magnetic layer 142 and the lanthanoid-layer 143 may be formed by sputtering. In an example of this embodiment, the sub-magnetic layer 142 is in amorphous state when formed. The lanthanoid-layer 143 comprises at least one of element from the lanthanoid group and in this example, consists of one of the lanthanoid elements.

Figure 7B:
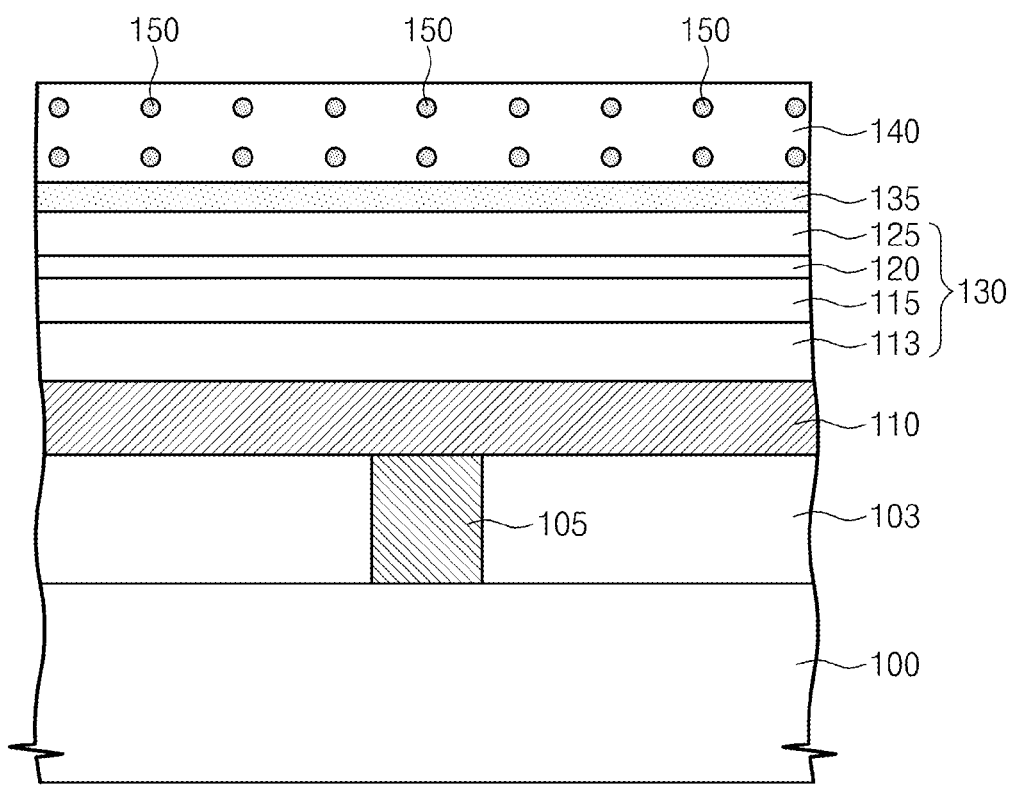

Referring to FIG. 7B, the substrate 100 is then thermally treated to form a magnetic layer 140 and at least one perpendicular magnetic segment 150 inside the magnetic layer 140. For example, the thermal treatment process heats the environment around the substrate 100 (e.g., interior of a processing chamber) to a process temperature of 300° C. to 600° C. The thermal treatment process may also entail providing an inert gas environment in which the substrate 100 is heated.

During the thermal treatment process, the sub-magnetic layers 142 of the multi-layered layer structure assume a crystalline state using the tunnel barrier layer 135 as a seed layer. Thus, the formed magnetic layer 140 has a crystalline state. Grains of the magnetic layer 140 can be grown by using grains in the tunnel barrier layer as seeds. The grains can be grown to what amounts to the top surface of the magnetic layer 140 by appropriate selection of the process time and/or process temperature of the thermal treatment process. Therefore, as described with reference to FIG. 1B, the magnetic layer 140 may be entirely in a crystalline state. Alternatively, the grain growth may be terminated before the grains reach what amounts to the top surface of the magnetic layer 140. In this case, the magnetic layer 140 may be formed so as to have the features described with reference to FIG. 1C.

In addition, as a result of the thermal treatment process, lanthanoid atoms in the lanthanoid-layer 143 are segregated in the grains of the magnetic layer 140, and combine with elements of the magnetic layer 140 to form the perpendicular magnetic segments 150.

Figure 8:
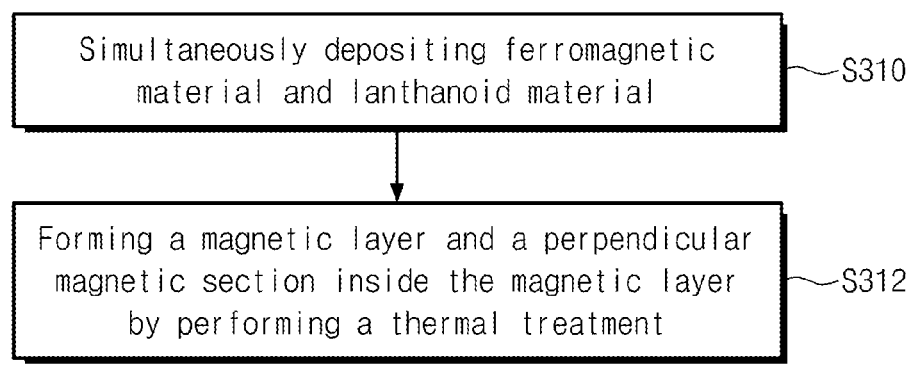
FIG. 8 is a flow-chart illustrating for a technique of forming a magnetic layer and a perpendicular magnetic section of a magnetic memory element in a method according to the inventive concept.

FIG. 8 is a flow-chart illustrating another technique of forming the magnetic layer and perpendicular magnetic segment(s).

Referring to FIGS. 7B and 8, ferromagnetic material and lanthanoid-based material may be deposited simultaneously on the reference layer 130 (step S310). For example, according to the inventive concept, the ferromagnetic material and the lanthanoid-based material are simultaneously formed by a sputter disposition process in which a target including both the ferromagnetic material and the lanthanoid-based material is bombarded or in which a first target of the ferromagnetic material and a second target of the lanthanoid-based material are concurrently bombarded.

Subsequently, a magnetic layer 140 and perpendicular magnetic segment(s) 150 inside the magnetic layer 140 are formed by thermally treating the substrate 100 (step S312). The lanthanoid atoms of the lanthanoid-based material are segregated in the ferromagnetic material by the thermal treatment. The remaining effects of the thermal treatment process are similar to those described above, e.g., the segregated lanthanoid atoms combine with adjacent elements of the ferromagnetic material to form the perpendicular magnetic segment(s) 150, and the ferromagnetic material is transformed so as to assume a crystalline state.

Figure 7C:
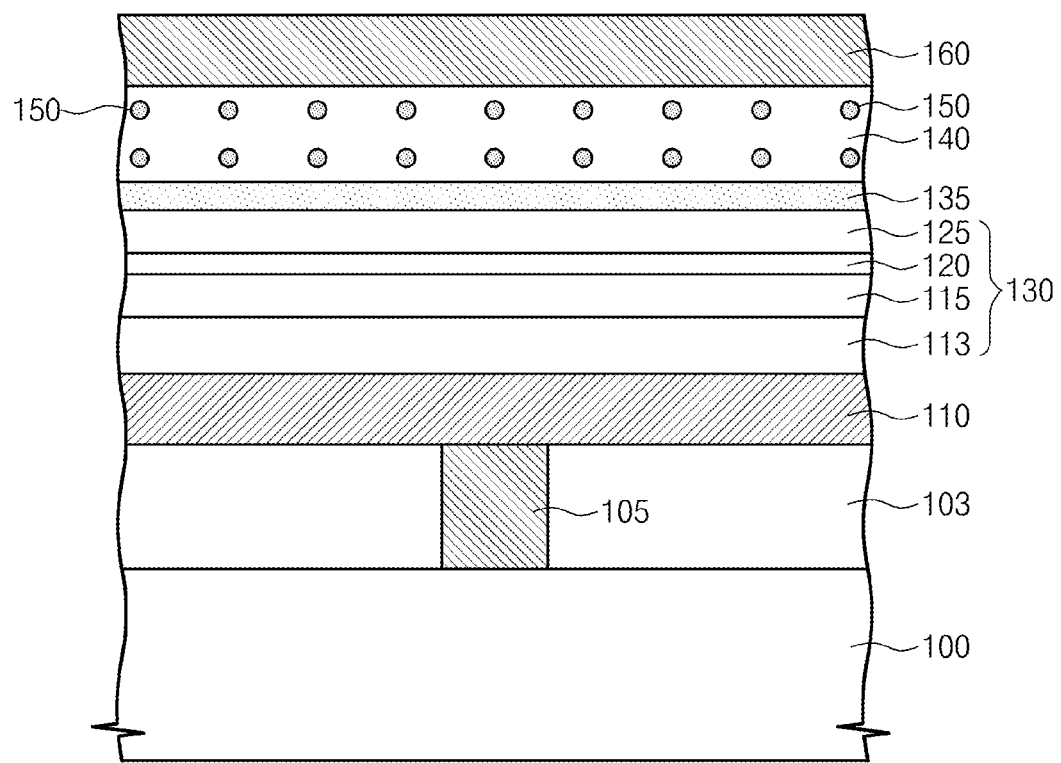

Subsequently, referring to FIG. 7C, a second electrode layer 160 is formed on the magnetic layer 140. The second electrode layer 160 may be formed by sputtering, CVD process or ALD.

Figure 7D:
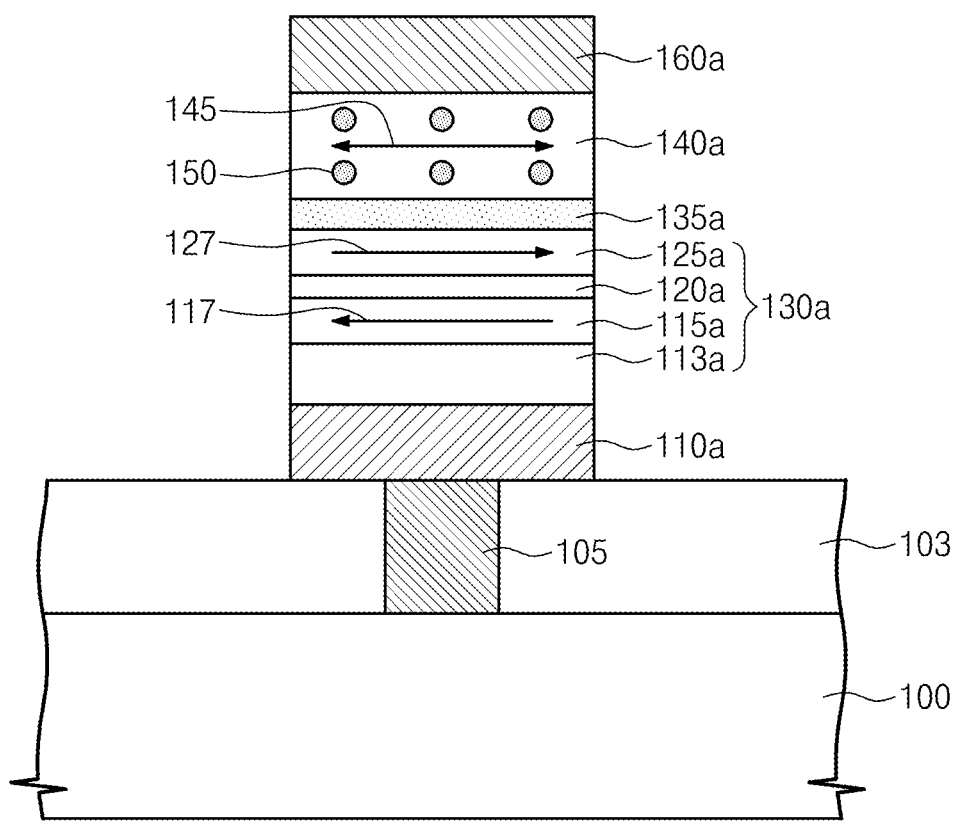

Referring to FIG. 7D, the second electrode layer 160, the magnetic layer 140, the tunnel barrier layer 135, the reference layer 130 and the first electrode layer 110 are then successively patterned to form the stacked first electrode 110a, reference pattern 130a, tunnel barrier pattern 135a, magnetic pattern 140a and second electrode 160a. Subsequently, a second interlayer dielectric layer 163, an upper contact plug 165 and an interconnection 170 (refer to FIG. 1A) are sequentially formed.

A method of fabricating magnetic memory devices, of the types shown in FIGS. 2A and 2B and/or FIGS. 3A and 3B, will now be described. The method is similar to that described above except where otherwise noted.

Figure 9:
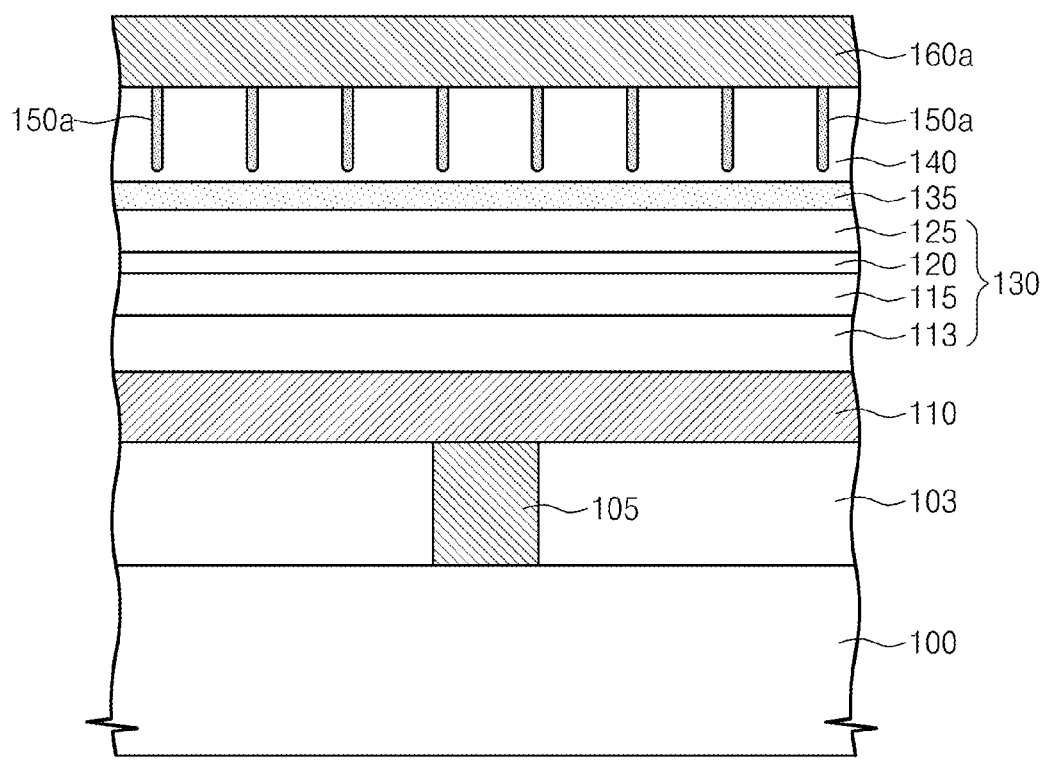
FIG. 9 is a cross-sectional view used to illustrate a method of fabricating a magnetic memory device according to the inventive concept.
Figure 10:
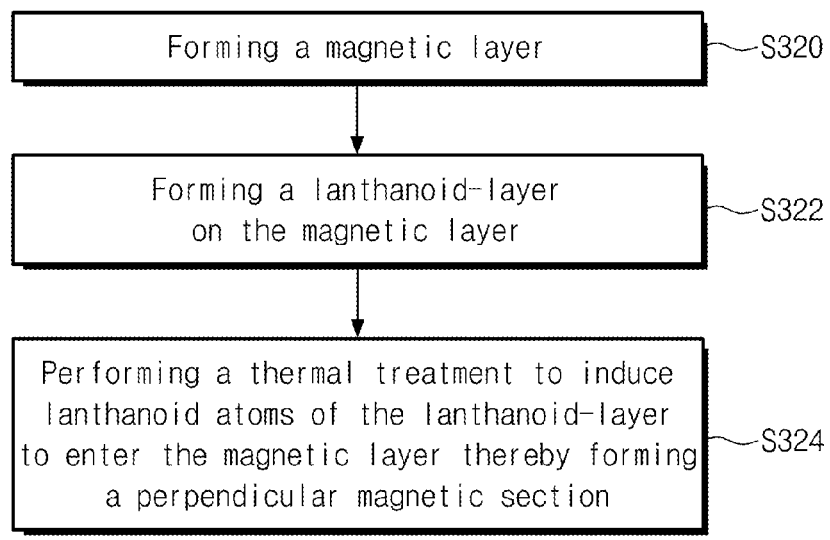
FIG. 10 is a flow-chart illustrating another technique of forming a magnetic layer and a perpendicular magnetic section of a magnetic memory element in a method according to the inventive concept.

Referring to FIG. 9, a magnetic layer 140 in a crystalline state having a plurality of grains and perpendicular magnetic segments 150a between the grains of the magnetic layer 140 are formed on the tunnel barrier layer 135. The technique for forming the magnetic layer 140 and the perpendicular magnetic segments 150a will be described with further reference to FIG. 10.

First, a magnetic layer is formed on the tunnel barrier layer 135 (step S320). In this example, the magnetic layer is formed of ferromagnetic material by sputtering. The magnetic layer may be grown in a crystalline state using the tunnel barrier layer 135 as a seed layer. Alternatively, the magnetic layer may be formed in an amorphous state.

Next, a lanthanoid-layer is formed on the magnetic layer (S322). A lanthanoid-layer refers to a layer of material comprising at least one of the elements from the lanthanoid group. The lanthanoid layer may be formed by sputtering.

Then the substrate 100 is thermally treated (step S324). As a result, lanthanoid atoms in the lanthanoid-layer diffuse into the magnetic layer to form the perpendicular magnetic segment(s) 150a in the magnetic layer 140a. If the magnetic layer is formed in a crystalline state, the lanthanoid atoms of the lanthanoid-layer diffuse along the grain boundaries of the magnetic layer due to the thermal treatment process. The diffused lanthanoid atoms combine with adjacent elements of the magnetic layer such that the perpendicular magnetic segment(s) 150a is formed between the grains of the magnetic layer, i.e., along the grain boundaries.

In addition, other atoms of the lanthanoid-layer may be segregated in the grains of the magnetic layer due to the thermal treatment process. Thus, perpendicular magnetic segments 150 may be formed inside the grains of the magnetic layer 140 as well, as shown in FIGS. 3A and 3B.

Alternatively, in the case in which the magnetic layer is formed (step S320) in an amorphous state, the magnetic layer may be transformed so as to assume a crystalline state. Then the process proceeds as described above with respect to the diffusion or diffusion and segregation of the lanthanoid atoms.

Alternatively, the magnetic layer 140 and the perpendicular magnetic segment(s) 150a can be formed by a technique as illustrated in FIG. 8. More specifically, the technique shown in FIG. 8 can be used to cause some of the lanthanoid atoms to be segregated along the grain boundaries of an underlying magnetic layer thereby forming the perpendicular magnetic segments 150a shown in FIG. 9.

Also, other lanthanoid atoms may be segregated in the grains as was described with reference to FIG. 8. Accordingly, perpendicular magnetic segments 150a and 150, as shown in and described with reference to FIGS. 3A and 3B, can be simultaneously formed.

And yet, the perpendicular magnetic segments 150 and 150a can be simultaneously formed by the technique shown in and described with reference to FIGS. 7A and 7B, as well. In this case, as is clear, some lanthanoid atoms in the lanthanoid layers 143 are segregated between the grains of the magnetic layer, and other lanthanoid atoms are segregated in the grains of the magnetic layer.

Figure 2A:
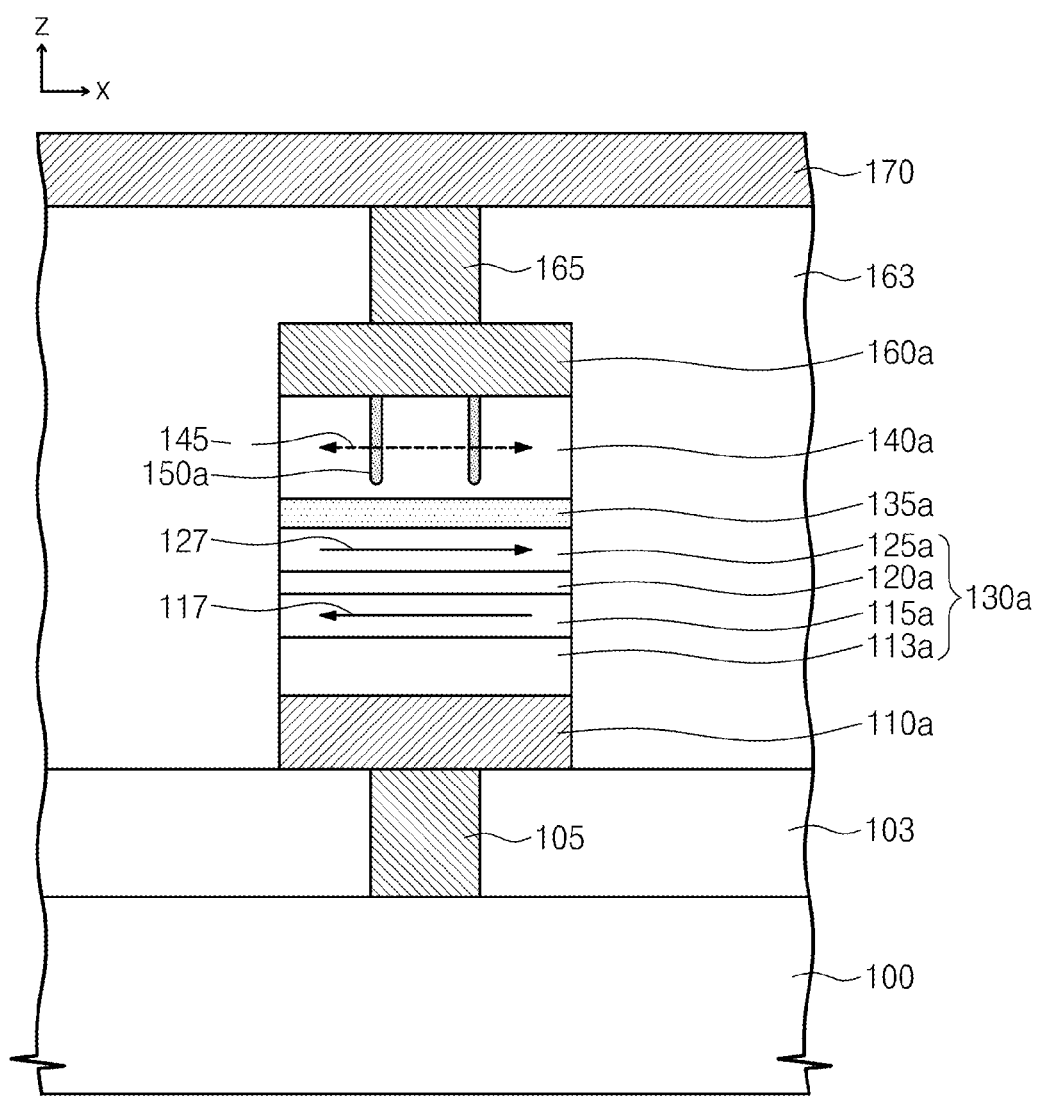
FIG. 2A is a cross-sectional view of still another example of a magnetic memory device according to the inventive concept.
Figure 2B:
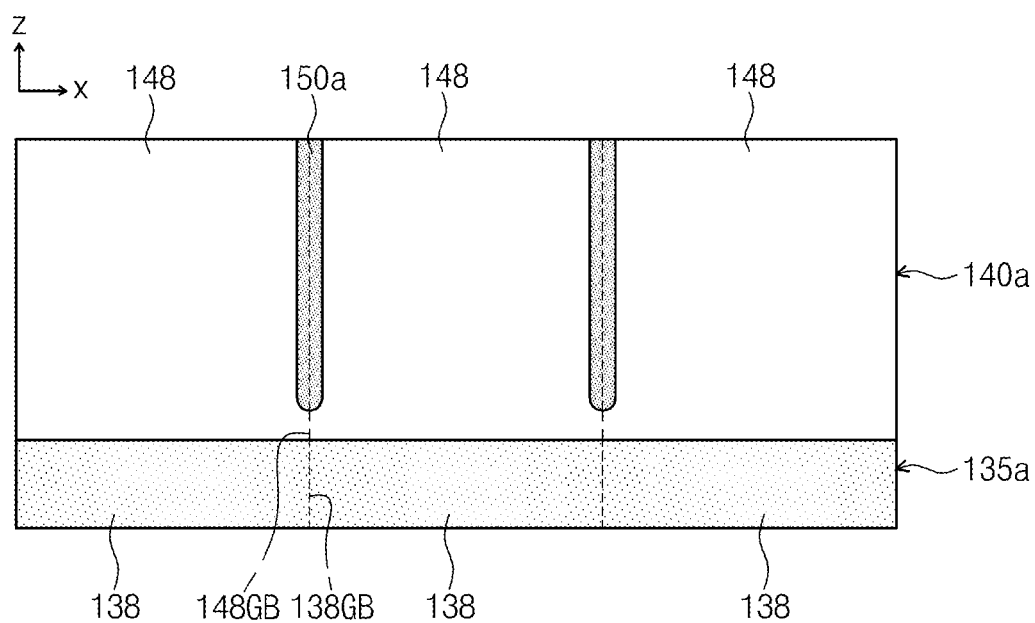
FIG. 2B is an enlarged cross-sectional view of an example of the tunnel barrier pattern, the magnetic pattern and the perpendicular magnetic segments of the magnetic memory device of FIG. 2A.

In any case, referring to FIGS. 9 and 2A, a second electrode layer 160 is then formed on the magnetic layer 140. The second electrode layer 160, the magnetic layer 140, the tunnel barrier layer 135, the reference layer 130 and the first electrode layer 110 are then successively patterned to form the stacked first electrode 110a, reference pattern 130a, tunnel barrier pattern 135a, magnetic pattern 140a and second electrode 160a. Then the second interlayer dielectric layer 163, the upper contact plug 165 and the interconnection 170 may be formed.

Figure 11:
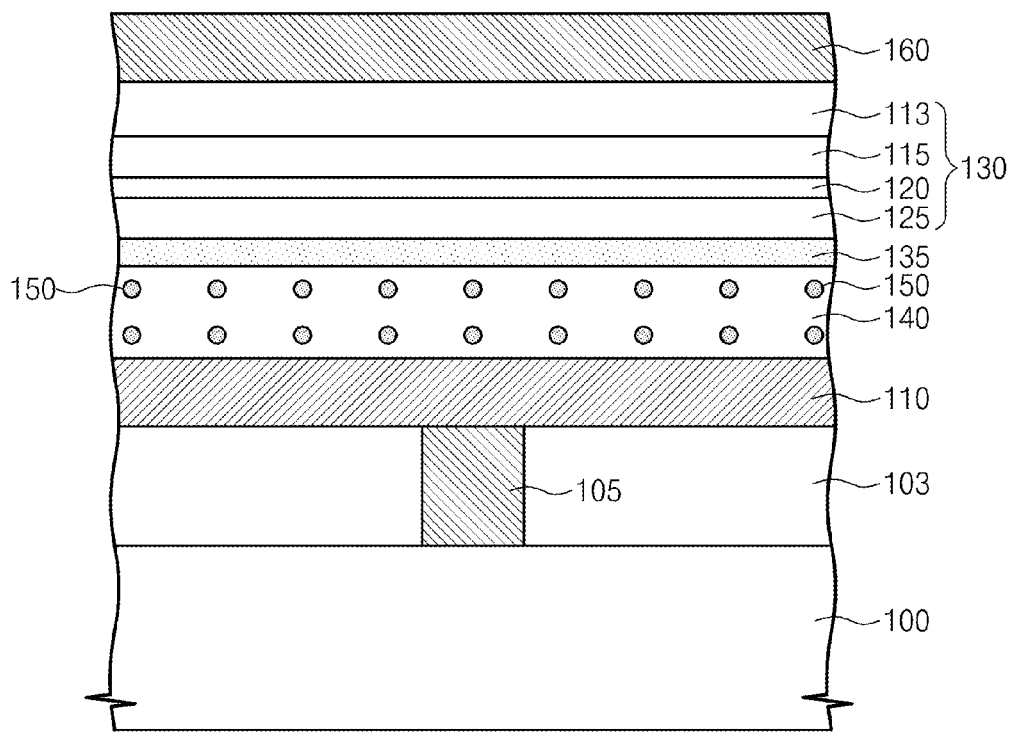
FIG. 11 is a cross-sectional view used to illustrate still another method of fabricating a magnetic memory device according to the inventive concept.

A method of forming a magnetic memory device of the type shown in and described with reference to FIG. 4, according to the inventive concept will be described with reference to FIGS. 4 and 11.

In this method, the first electrode layer 110 is formed in a crystalline state, specifically a poly-crystalline state. Magnetic layer 140 and perpendicular magnetic segments inside the magnetic layer 140 are formed on the first electrode layer 110 according to any of the techniques described above with reference to FIGS. 7A through 7B, and 8 through 10. In this embodiment, the first electrode layer 110 can be used as a seed layer for forming the magnetic layer 140.

A tunnel barrier layer 135, a reference layer 130 and a second electrode layer 160 are then formed on the magnetic layer 140. The reference layer 130 may include a main pinned layer 125, an exchange coupling layer 120, an assistant pinned layer 115 and a pinning layer 113 which are sequentially formed in the foregoing order one atop the other.

The layers 160, 130, 135, 140 and 110 are then successively patterned to form the first electrode 110a, the magnetic pattern 140, the tunnel barrier pattern 135, the reference pattern 130 and the second electrode 160a. Subsequently, the second interlayer dielectric layer 163, the upper contact plug 165 and the interconnection 170 are formed.

Figure 12:
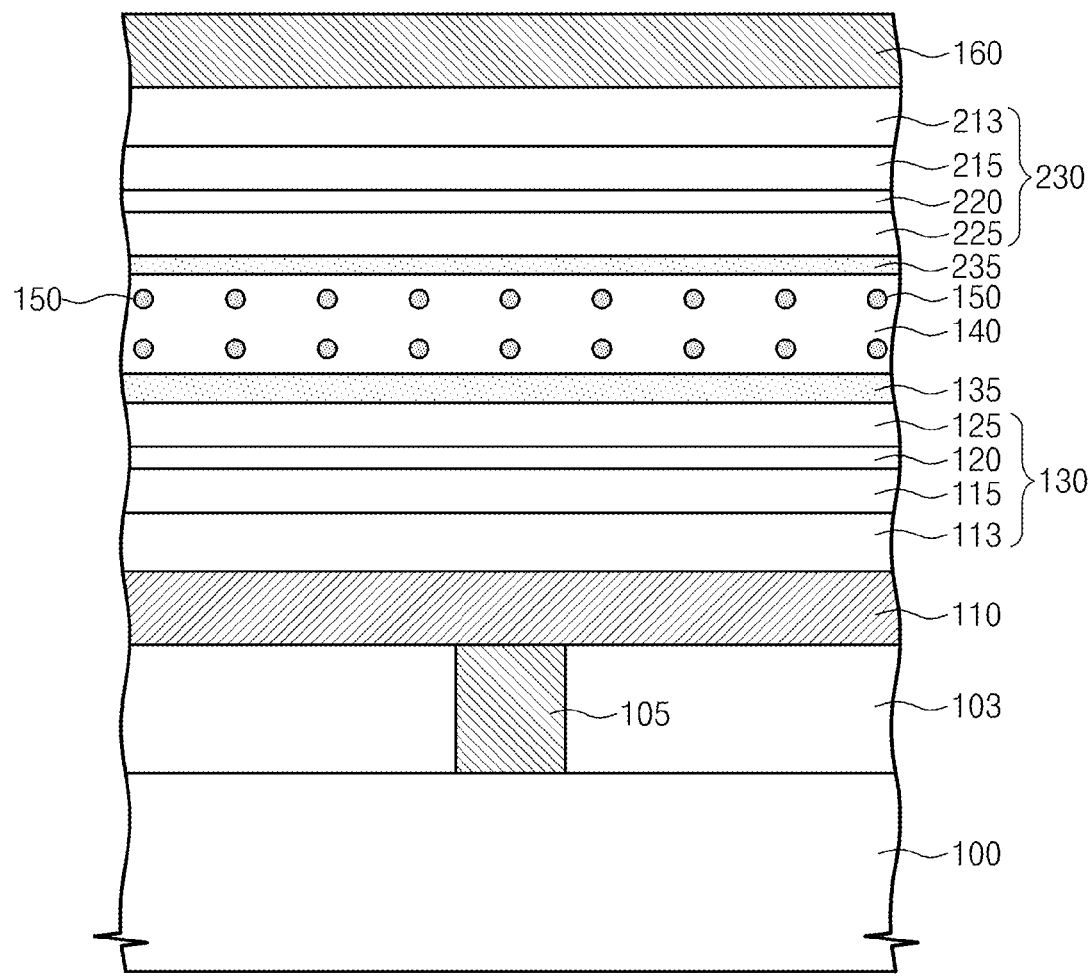
FIG. 12 is a cross-sectional view used to illustrate still another method of fabricating a magnetic memory device according to the inventive concept.

A method of forming a magnetic memory device of the type shown in and described with reference to FIG. 5, according to the inventive concept will be described with reference to FIGS. 5 and 12.

A first electrode layer 110, a first reference layer 130 and a first tunnel barrier layer 135 are sequentially formed on first interlayer dielectric layer 103. The first reference layer 130 may be formed by forming a first pinning layer 113, a first assistant pinned layer 115, a first exchange coupling layer 120 and a first main pinned layer 125 one atop the other in the foregoing sequence. A magnetic layer 140 and a perpendicular magnetic segment(s) are formed on the first tunnel barrier layer 135 according to any of the techniques described above with reference to FIGS. 7A through 7B, and 8 through 10.

A second tunnel barrier layer 235, a second reference layer 230 and a second electrode layer 160 are then sequentially formed on the magnetic layer 140. The second reference layer 230 may be formed by forming a second main pinned layer 225, a second exchange coupling layer 220, a second assistant pinned layer 215 and a second pinning layer 213 one atop the other in the foregoing sequence.

As is clear from the description above with reference to FIG. 5, the second tunnel barrier layer 235 may be formed such that its resistivity is different from that of the first tunnel barrier layer 135. Also, the first tunnel barrier layer 135 and the second tunnel barrier layer 235 may be formed to different thicknesses. Still further, the first tunnel barrier layer 135 and the second barrier layer 135 may be formed so as to have different resistivities and thicknesses. Furthermore, the first pinned layer 113 and the second pinned layer 213 are formed such that their blocking temperatures are different.

Subsequently, the second electrode layer 160, the second reference layer 230, the second tunnel barrier layer 235, the magnetic layer 140, the first tunnel barrier layer 135, the first reference layer 130 and the first electrode layer 110 are successively patterned to form the first electrode 110a, the first reference pattern 130a, the first tunnel barrier pattern 135a, the magnetic pattern 140a, the second tunnel barrier pattern 235, the second reference pattern 230 and the second electrode 160a. The second interlayer dielectric layer 163, the upper contact plug 165 and the interconnection 170 are then formed.

Figure 13:
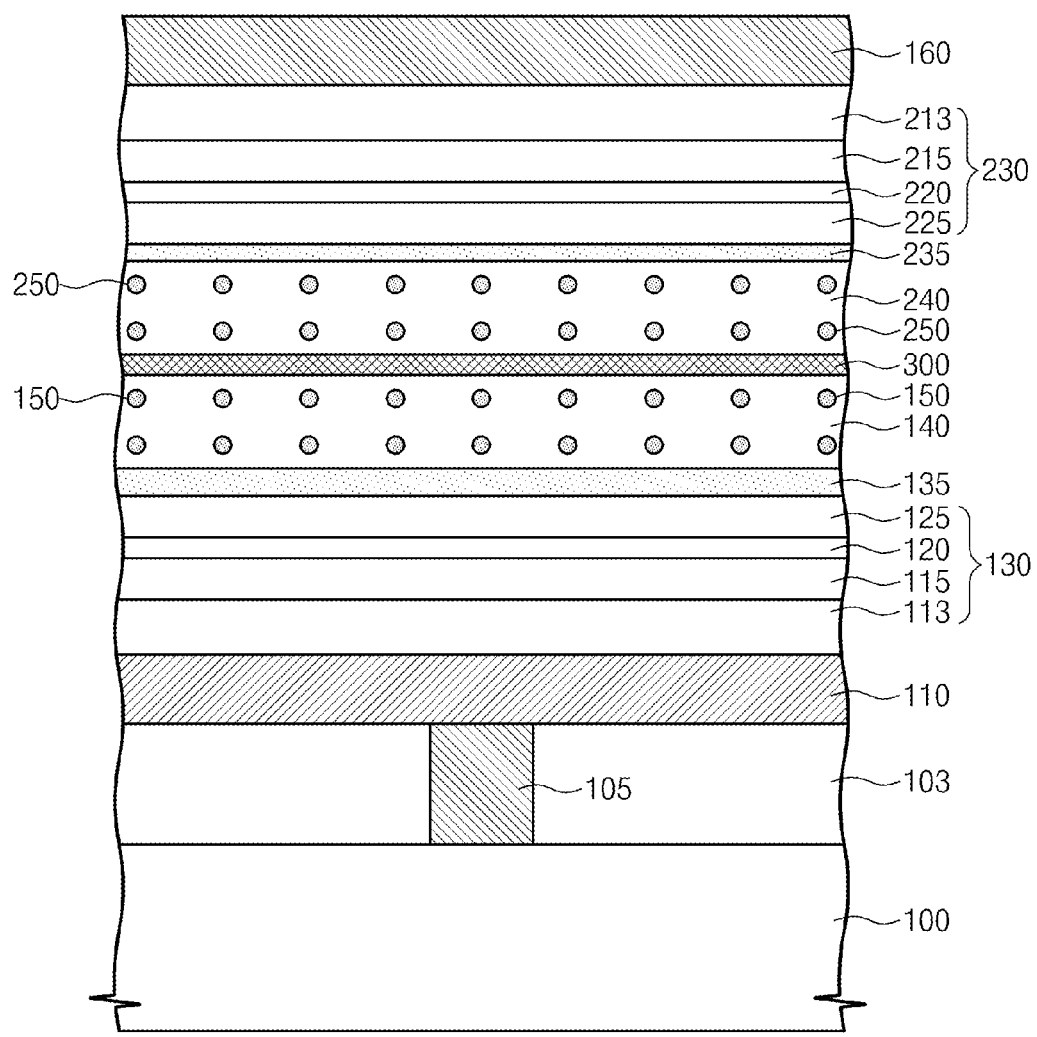
FIG. 13 is a cross-sectional view used to illustrate yet another method of fabricating a magnetic memory device according to the inventive concept.

A method of forming a magnetic memory device of the type shown in and described with reference to FIG. 6, according to the inventive concept will be described with reference to FIGS. 6 and 13.

A first electrode layer 110, a first reference layer 130 and a first tunnel barrier layer 135 are sequentially formed on the first interlayer dielectric layer 103. A first magnetic layer 140 and perpendicular magnetic segment(s) inside the first magnetic layer 140 are then formed, from among the techniques described above with reference to FIG. 5, on the first tunnel barrier layer 135.

Next, an intermediate layer 300 is formed on the first magnetic layer 140. A second magnetic layer 240 and perpendicular magnetic segment(s) 250 inside the magnetic layer 240 are formed, from among the techniques described above also with reference to FIG. 5, on the intermediate layer 300.

A second tunnel barrier layer 235, a second reference layer 230 and a second electrode layer 160 are then sequentially formed on the second magnetic layer 240. The layers 160, 230, 235, 240, 300, 140, 135, 130 and 110 are successively patterned to form the first electrode 110a, the first reference pattern 130a, the first tunnel barrier pattern 135a, the first magnetic pattern 140a, the intermediate pattern 300a, the second magnetic pattern 240a, the second tunnel barrier pattern 235a, the second reference pattern 230a and the second electrode 160a. Subsequently, the second interlayer dielectric layer 163, the upper contact plug 165 and the interconnection 170 are formed.

A magnetic memory device according to the inventive concept may be may be packaged in various ways. For example, the magnetic memory device may be assembled as part of a PoP (Package on Package), a BGA (Ball grid array) package, a CSP (Chip Scale Package), a PDIP (Plastic Dual In-line Package), a Die in Waffle Pack, a Die in Wafer Form, a COB (Chip On Board), a CERDIP (Ceramic Dual In-line Package), a MQFP (Plastic Metric Quad Flat Pack), a TQFP (Thin Quad Flat Pack), a SOIC(Small Outline Integrated Circuit), a SSOP (Shrink Small Outline Package), a TSOP (Thin Small Outline Package), a TQFP (Thin Quad Flat Pack), a SIP (System In Package), a MCP (Multi Chip Package), a WFP (Wafer-level Fabricated Package), or a WSP (Wafer-level Processed Stack Package).

The packages including a magnetic memory device according to the inventive concept may also include a controller and/or a logic circuit for managing the magnetic memory device.

Figure 14:
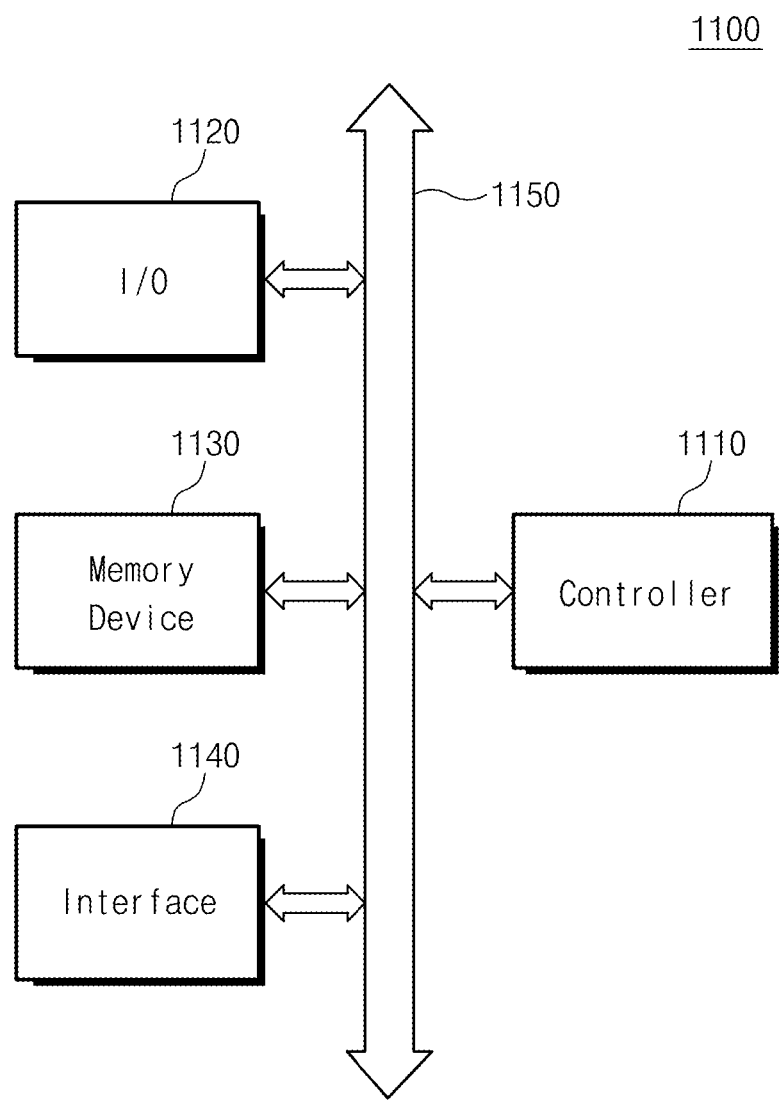
FIG. 14 is a block diagram of an electronic system including a magnetic memory device according to the inventive concept.

FIG. 14 illustrates an example of an electronic system 1100 including a magnetic memory device according to the inventive concept.

Referring to FIG. 14, the electronic system 1100 includes a controller 1110, an input/output device (hereinafter 'I/O device') 1120, a memory device 1130, an interface 1140 and a bus 1150. The controller 1110, the I/O device 1120, the memory device 1130 and/or the interface 1140 are connected through the bus 1150. The bus 1150 provides a path through which data are transferred.

The controller 1110 includes at least one of a micro-processor, a digital signal processor, a micro-controller and other logic devices performing similar functions. The I/O device 1120 may comprise a keypad, a keyboard and a display device. The memory device 1130 typically contains data and/or command codes. The memory device 1130 thus includes at least one of the magnetic memory devices according to the inventive concept. The memory device 1130 may also include semiconductor memory devices such as flash memory devices and/or phase changeable memory devices. The interface 1140 facilitates the transmitting of data to a network or the receiving of data from a network. The interface 1140 may be a wire or wireless type. For example, the interface 1140 may comprise an antenna or a wire/wireless transceiver. The electronic system 1100 may also include high speed DRAM devices and/or SRAM devices for enhancing the operation of the controller 1110.

The electric system 1110 may be employed by a personal digital assistant (PDA), a mobile phone, a digital music player, a memory card or other electronics capable of transmitting and/or receiving data in a wire and/or wireless environment.

Figure 15:
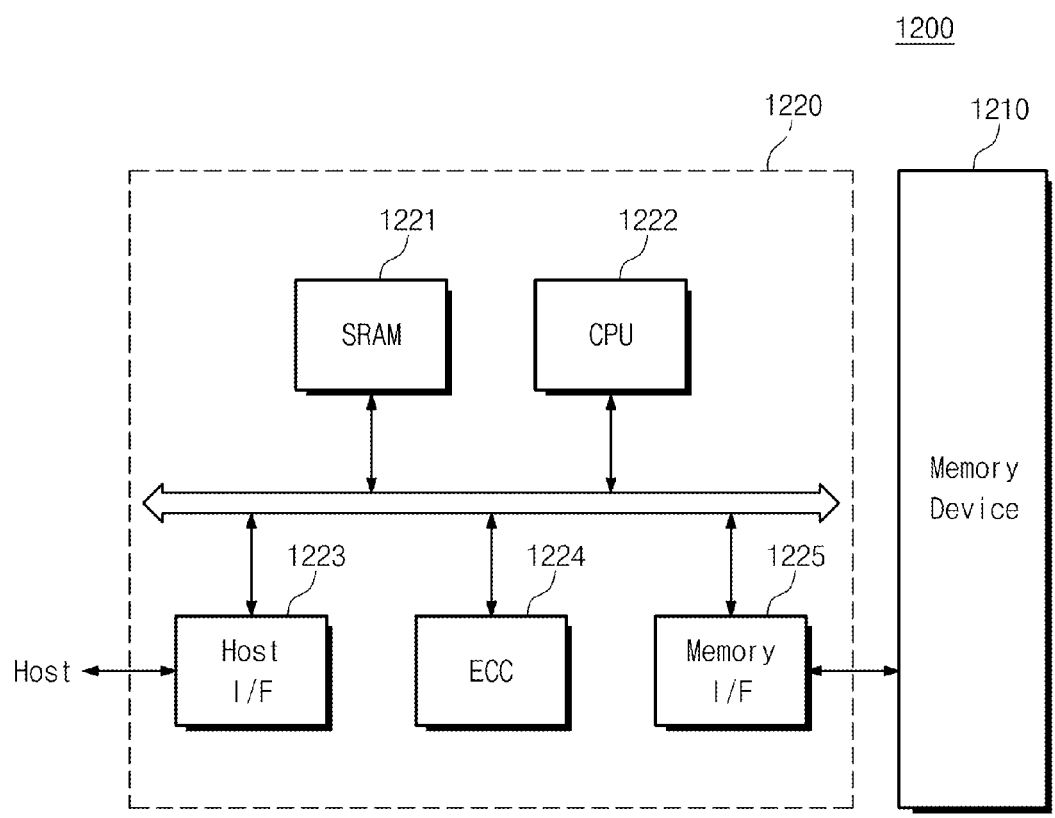
FIG. 15 is a block diagram of a memory card including a magnetic memory device according to the inventive concept.

FIG. 15 illustrates an example of a memory card 1200 including a magnetic memory device according to the inventive concept.

Referring to FIG. 15, the memory card 1200 includes a memory device 1210. The memory device 1210 includes at least one of the magnetic memory devices according to the inventive concept. The memory device 1210 may also include a semiconductor memory device such as a flash memory device, a phase changeable memory device and a DRAM and/or an SRAM. The memory card 1200 of this example also includes a memory controller 1220 configured to manage the exchange of data between host and the memory device 1210.

The memory controller 1220 may, as shown in this example, includes a processing unit 1222 for controlling all of the processes performed by the memory card. The memory controller 1220 also includes an SRAM 1221 as an operation memory of the processing unit 1222, a host interface 1223 and a memory interface 1225. The host interface 1223 contains the data exchange protocol between the memory card 1200 and the host. The memory interface 1225 connects the memory controller 1220 and the memory device 1210. The memory controller 1220 also has an error collection block (ECC) 1224. The ECC 1224 can detect and collect errors in the data from the memory device 1210. The memory card 1200 may also include a ROM device (not shown) storing code data for interfacing with the host.

Such a memory card 1200 may be embodied as a portable data storing card. These elements may also be embodied as a solid state drive.

According to an aspect of the inventive concept as described in detail above, one or more perpendicular magnetic segments is/are disposed inside the magnetic pattern to in effect lower the critical current density. Therefore, the magnetic memory element can remain thick enough and/or have sufficient saturation magnetization to possess a high data retention characteristic while consuming a relatively low amount of power. This also leads to the realization of a magnetic memory device of superior reliability.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A magnetic memory device, comprising:
a substrate;
a magnetic pattern and a reference pattern juxtaposed on the substrate, the reference pattern comprising magnetic material having a magnetization whose orientation is fixed, and the magnetization of the magnetic pattern being changeable between a first state in which the magnetization directions of the magnetic pattern and the reference pattern are parallel and a second state in which the magnetization directions of the magnetic pattern and reference pattern are anti-parallel;
a tunnel barrier pattern interposed between the magnetic pattern and the reference pattern; and
at least one magnetic segment disposed in the magnetic pattern,
wherein the magnetic segment is of magnetic material whose direction of magnetization has at least a component coincident with a plane perpendicular to the direction of magnetization of the magnetic pattern.

2. The magnetic memory device of claim 1, wherein the magnetic material of the magnetic segment is a compound comprising at least one element of the lanthanide series.

3. The magnetic memory device of claim 1, wherein the magnetic material of the magnetic segment is in an amorphous state.

4. The magnetic memory device of claim 1, wherein the magnetization directions of the magnetic pattern and the reference pattern are substantially parallel to the surface of the magnetic pattern which lies closest to the tunnel barrier pattern.

5. The magnetic memory device of claim 1, wherein at least a portion of the magnetic pattern is in a crystalline state having at least one grain, and
the magnetic segment is disposed entirely within the grain.

6. The magnetic memory device of claim 5, wherein the magnetic material of the magnetic segment is of a compound comprising at least one of the elements of the lanthanide series and at least one element constituting the material of the magnetic pattern.

7. The magnetic memory device of claim 1, wherein a one part of the magnetic pattern is in a crystalline state and another part of the magnetic pattern is in an amorphous state.

8. The magnetic memory device of claim 1, wherein the magnetization direction of the magnetic material of the magnetic segment is oblique with respect to the direction of magnetization of the magnetic pattern.

9. The magnetic memory device of claim 1, wherein at least a portion of the magnetic pattern is in a crystalline state having at least two grains with a grain boundary therebetween, and
the magnetic segment has extends along the grain boundary.

10. The magnetic memory device of claim 1, further comprising upper and lower electrically conductive elements between which the magnetic pattern, reference pattern and tunnel barrier pattern are stacked.

11. The magnetic memory device of claim 1, wherein the tunnel barrier pattern comprises a layer of dielectric.

12. A magnetic memory device, comprising:
a substrate;
a magnetic pattern and first and second reference patterns juxtaposed with the magnetic pattern on the substrate, the first and second reference patterns each comprising magnetic material having a magnetization whose orientation is fixed, and the magnetization of the magnetic pattern being changeable between a first state in which the magnetization directions of the magnetic pattern and the first reference pattern are parallel and a second state in which the magnetization directions of the magnetic pattern and first reference pattern are anti-parallel;
a first tunnel barrier pattern interposed between the magnetic pattern and the first reference pattern;
at least one magnetic segment disposed in the magnetic pattern; and
a second tunnel barrier pattern interposed between the second reference pattern and the magnetic pattern, and
wherein the magnetic segment is of magnetic material whose direction of magnetization has at least one component coincident with a plane perpendicular to the direction of magnetization of the magnetic pattern, and
the magnetization direction of the first reference pattern and the magnetization direction of the second reference pattern are anti-parallel.

13. The magnetic memory device of claim 12, wherein the magnetic material of the magnetic segment is a compound comprising at least one element of the lanthanide series.

14. The magnetic memory device of claim 12, further comprising upper and lower electrically conductive elements between which the first and second reference patterns, the magnetic pattern, and the first and second tunnel barrier patterns are stacked.

15. The magnetic memory device of claim 12, wherein the first and second tunnel barrier patterns each comprise a layer of dielectric.

16. The magnetic memory device of claim 12, wherein the thickness and/or resistivities of the first and second tunnel barrier patterns are different from each other.

17. A magnetic memory device, comprising:
a substrate;
a first magnetic pattern and a first magnetic reference pattern juxtaposed with the first magnetic pattern on the substrate, the first reference pattern comprising magnetic material having a magnetization whose orientation is fixed, and the magnetization of the first magnetic pattern being changeable between a first state in which the magnetization directions of the first magnetic pattern and the first reference pattern are parallel and a second state in which the magnetization directions of the first magnetic pattern and first reference pattern are anti-parallel;
a first tunnel barrier pattern interposed between the first magnetic pattern and the first reference pattern;
at least one magnetic segment disposed in the first magnetic pattern;
a second magnetic pattern and a second reference pattern juxtaposed with the second magnetic pattern on the substrate, the second reference pattern comprising magnetic material having a magnetization whose orientation is fixed;
a second tunnel barrier pattern interposed between the second magnetic pattern and the second reference pattern;
at least one magnetic segment disposed in the second magnetic pattern; and
an interlayer pattern interposed between the first and second magnetic patterns, and
wherein the magnetic segment disposed in the first magnetic pattern is of magnetic material whose direction of magnetization has at least a component coincident with a plane perpendicular to the direction of magnetization of the first magnetic pattern,
the magnetic segment disposed in the second magnetic pattern is of magnetic material whose direction of magnetization has at least a component coincident with a plane perpendicular to the direction of magnetization of the second magnetic pattern, and
the magnetization of the second magnetic pattern and the magnetization of the first magnetic pattern are coupled such that the directions of magnetization of the first and second magnetic patterns are anti-parallel.

18. The magnetic memory device of claim 17, wherein each of the magnetic materials disposed in the first and second magnetic patterns is a compound comprising at least one element of the lanthanide series.

19. The magnetic memory device of claim 17, further comprising upper and lower electrically conductive elements between which the first and second reference patterns, the magnetic pattern, and the first and second tunnel barrier patterns are stacked.

20. The magnetic memory device of claim 17, wherein the interlayer pattern is of at least one material selected from the group consisting of ruthenium, iridium and rhodium.

* * * * *